United States Patent [19]

Izawa et al.

[11] Patent Number: 5,850,096

[45] Date of Patent: Dec. 15, 1998

[54] ENHANCED SEMICONDUCTOR INTEGRATED CIRCUIT DEVICE WITH A MEMORY ARRAY AND A PERIPHERAL CIRCUIT

[75] Inventors: Tetsuo Izawa; Hiroshi Goto; Koichi Hashimoto, all of Kawasaki, Japan

[73] Assignee: Fujitsu Limited, Kawasaki, Japan

[21] Appl. No.: 394,347

[22] Filed: Feb. 23, 1995

[30] Foreign Application Priority Data

| Feb. 25, 1994 | [JP] | Japan | ..................................... | 6-027146 |
| Aug. 4, 1994 | [JP] | Japan | ..................................... | 6-183159 |
| Dec. 14, 1994 | [JP] | Japan | ..................................... | 6-311020 |

[51] Int. Cl.⁶ .................................................. H01L 29/00
[52] U.S. Cl. .......................... 257/377; 257/327; 257/357; 257/369; 257/384; 257/407; 365/185
[58] Field of Search ...................... 257/327, 357, 257/369, 377, 384, 407; 365/185

[56] References Cited

U.S. PATENT DOCUMENTS 4,800,528  1/1989  Geddes ..................................... 365/185
4,988,643  1/1991  Tsou .

*Primary Examiner*—Valencia Wallace
*Attorney, Agent, or Firm*—Armstrong, Westerman, Hattori McLeland & Naughton

[57] ABSTRACT

A method for fabricating a semiconductor integrated circuit includes the steps of providing a conductor film on a substrate, providing an insulator film on the conductor film to form a layered structure, removing the insulator film selectively from a first part thereof corresponding to a conductor pattern to be formed, while remaining the insulator film on a second part thereof corresponding also to a conductor pattern to be formed, patterning the layered structure to form a conductor pattern defined by side walls, providing a side wall insulation to each of the side walls of the conductor pattern, providing a first local interconnect pattern on the first part of the conductor pattern such that the first local interconnect pattern establishes an electrical connection with the conductor pattern at the first part, and providing a second local interconnect pattern on the second part of the conductor pattern such that the second local interconnect pattern bridges across the conductor pattern at the second part, without establishing electrical connection therewith.

8 Claims, 23 Drawing Sheets

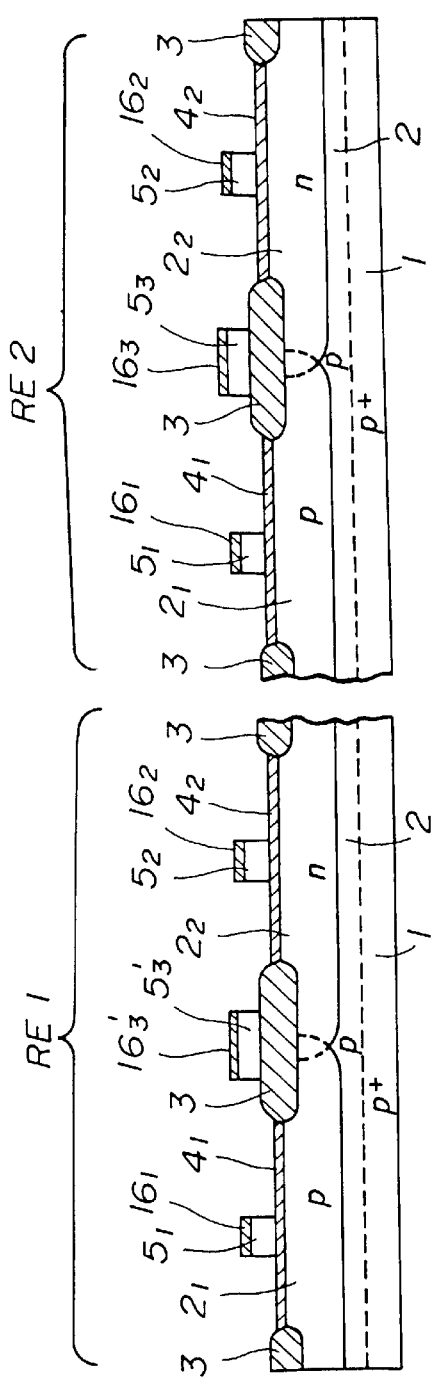
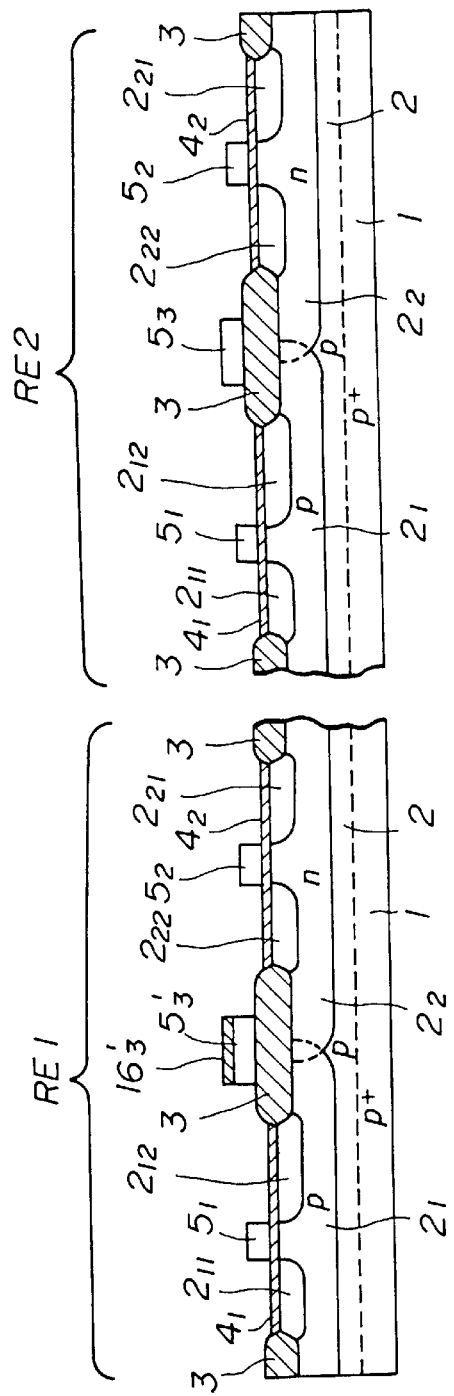
FIG. 3C
FIG. 3D

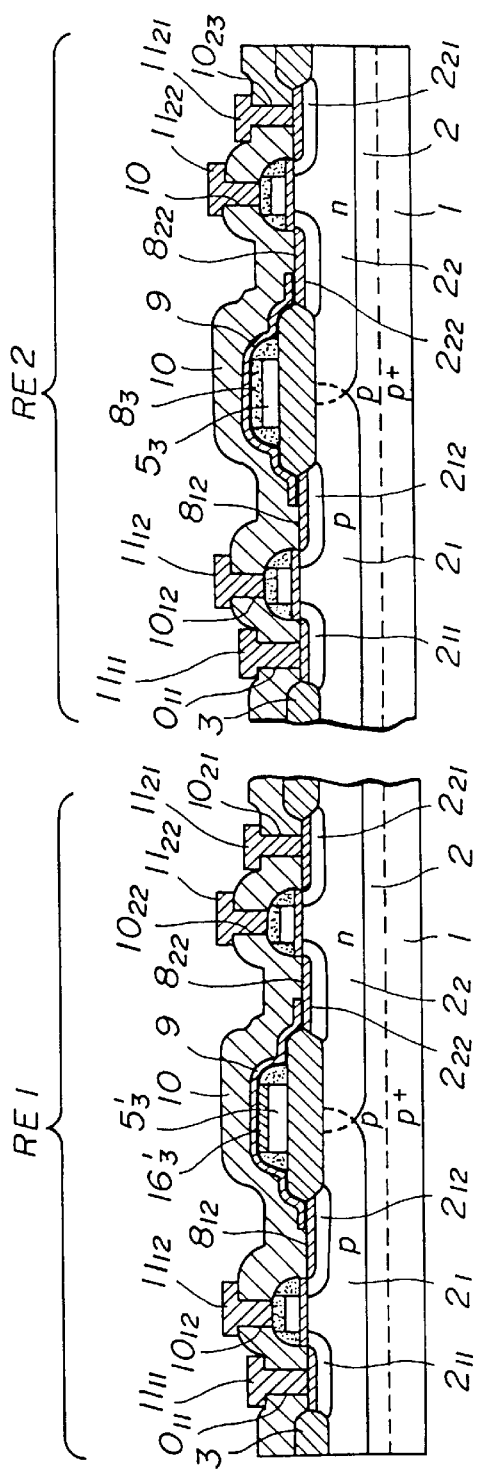

FIG.13I
FIG.13J
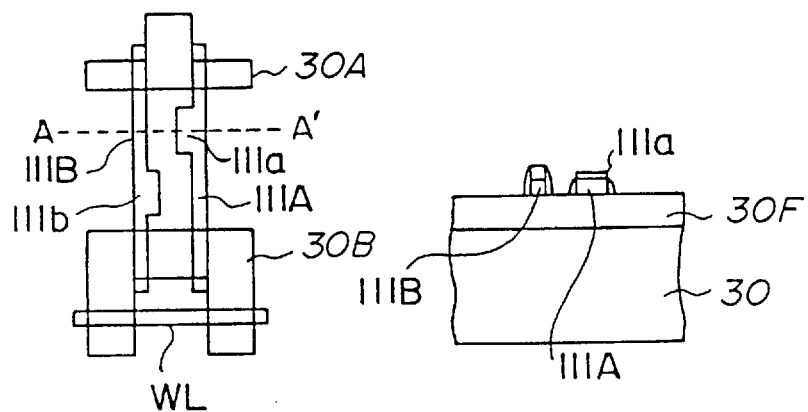
FIG.13K
FIG.13L
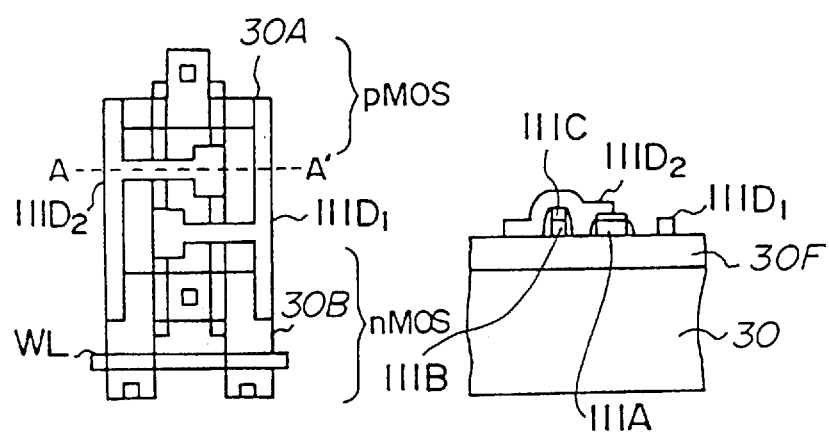

ENHANCED SEMICONDUCTOR INTEGRATED CIRCUIT DEVICE WITH A MEMORY ARRAY AND A PERIPHERAL CIRCUIT

BACKGROUND OF THE INVENTION

The present invention generally related to fabrication of semiconductor integrated circuits and more particularly to the fabrication process of a semiconductor integrated circuit, a typical example being a static random access memory, wherein a local interconnect pattern is provided for substrating semiconductor devices on a substrate.

MOS integrated circuits are used extensively for various logic integrated circuits as well as for various memory integrated circuits such as a CMOS static random access memory, due to the advantageous feature of low power consumption that characterizes a MOS semiconductor device.

In a CMOS static random access memory, a number of MOS transistors, each including a source region, a drain region and a gate electrode, are formed in rows and columns on a substrate, and an insulation film is provided such that the MOS transistors are buried underneath the insulation film. In order to provide an electrical interconnection, such an insulation film is provided with contact holes and an electrode pattern is provided on the insulation film such that the electrode pattern fills the contact holes and achieve a desired interconnection or wiring of the MOS transistors.

In such a conventional approach of wiring, it is necessary to form the contact holes with sufficient tolerance for achieving reliable contact with the active regions such as source, drain or gate, while such a formation of minute contact holes with tolerance becomes extremely difficult with increasing degree of miniaturization and hence integration density of the integrated circuit.

In order to avoid this problem and to provide a wiring conductor pattern without providing a contact hole, it has been proposed to provide a local interconnect pattern separately from ordinary wiring patterns, for wiring between the source region, the drain region and the gate electrode (T. Tang, et al, IEEE International Electron Device Meeting 85m 1985, Technical Digest, pp. 590–593).

FIGS. 1A and 1B show such a local interconnect pattern used in conventional semiconductor integrated circuits, wherein FIG. 1A shows the cross section of the integrated circuit while FIG. 1B shows a circuit diagram thereof.

Referring to FIG. 1A, the integrated circuit is formed on a silicon substrate 61 of p$^+$-type on which p-type layer 62 of silicon is formed epitaxially. Further, a p-type well 62$_1$ and an n-type well 62$_2$ are formed in the layer 62, wherein there is formed a field oxide film 63 on the silicon layer 62 in correspondence to the boundary between the p-type well 62$_1$ and n-type well 62$_2$. In the p-type well 62$_1$, an n-type source region 62$_{11}$ and an n-type drain region 62$_{12}$ are formed as usual in n-channel MOS transistors, and there is formed an n-channel MOS transistor N1 in the p-type well 62$_2$ as usual in p-channel type drain region 62$_{22}$ and a p-type source region 62$_{21}$ are formed in the n-type well 62$_2$ as usual in p-channel MOS transistors, and there is formed a p-channel MOS transistor P1 in the n-type well 62$_2$. In correspondence to the channel region of each of the p-channel MOS transistor P1 and the n-channel MOS transistor N1, there is provided a gate oxide film 64 of silicon oxide on the silicon layer 62, and a gate electrode 65$_1$ is provided on the gate oxide film 64 covering the channel region of the n-channel MOS transistor N1. Similarly, a gate electrode 65$_2$ is provided on the gate oxide film 64 that covers the channel region of the p-channel MOS transistor P1. It should be noted that each of the gate electrodes has a pair of insulating side walls 66$_{11}$ and 66$_{12}$ or 66$_{21}$ and 66$_{22}$, wherein the surface part of the gate electrodes 65$_1$ or 65$_2$ is formed with a silicide layer 67$_{13}$ or 67$_{23}$. Further, silicide layers are also formed on the surface part of the source regions 62$_{11}$ and 62$_{21}$ as well as on the surface part of the drain regions 62$_{12}$ and 62$_{22}$ as layers 67$_{11}$, 67$_{12}$, 67$_{21}$ and 67$_{22}$.

In the structure of FIG. 1A, it will be noted that there is provided a polysilicon pattern 65$_3$ on the field oxide film 63, wherein the polysilicon pattern 65$_3$ carries a silicide region 67$_3$ on the surface part thereof, and the polysilicon pattern 65$_3$ as well as the silicide region 67$_3$ thereon carry a pair of side wall insulators 66$_{31}$ and 66$_{32}$ of silicon oxide. Further, a local interconnect pattern 68 of TiN covers the polysilicon pattern 65$_3$, wherein the polysilicon pattern 65$_3$ establishes contact engagement with the silicide region 67$_3$ of the polysilicon pattern 65$_3$ and extends over the side wall insulators 66$_{31}$ and 66$_{32}$ and further over the exposed surface of the field oxide film 63 and reaches the drain region 62$_{12}$ of the n-channel MOS transistor N1 as well as the drain region 62$_{22}$ of the p-channel MOS transistor P1. Thus, the local interconnect pattern 68 establishes a contact engagement with the silicide layers 67$_{12}$ and 67$_{22}$ and the diffusion regions 62$_{12}$ and 62$_{22}$, and the n-channel MOS transistor N1 and the p-channel MOS transistor P1 form together a CMOS circuit.

As indicated in the circuit diagram of FIG. 1B, it should be noted that the local interconnect pattern 68 connects the drains of the p-channel MOS transistor P1 and the n-channel MOS transistor N1 with each other, wherein the local interconnect pattern 68 connects the drains of the transistors P1 and N1 further with the gate electrodes of other p-channel and n-channel MOS transistors P2 and N2. Thereby, a flip-flop circuit forming a memory cell of static random access memory is obtained. By providing the interconnection in the form of local interconnect pattern 68, it is possible to eliminate the contact hole, and one can achieve miniaturization of the device without being restrained by the tolerance of the contact holes. It should be noted that the local interconnect pattern 68 is formed by depositing a layer of a refractory metal such as TiN, followed by a patterning process of the TiN layer thus deposited.

In the fabrication of such a semiconductor integrated circuit that uses the local interconnect pattern shown in FIGS. 1A and 1B, it should be noted that there occurs a case in which it is desired to connect the drain region 62$_{21}$ to the drain region 62$_{22}$ by means of the local interconnect pattern, 68 without contacting to the conductor pattern 65$_3$ and hence to the silicide region 67$_3$ thereon. As long as the construction of FIG. 1A is employed, however, the local interconnect pattern inevitably contacts with the polysilicon pattern 65$_3$ at the exposed silicide layer 67$_3$.

SUMMARY OF THE INVENTION

Accordingly, it is a general object of the present invention to provide a novel and useful fabrication process of a semiconductor integrated circuit wherein the foregoing problems are eliminated.

Another and more specific object of the present invention is to provide a fabrication process of a semiconductor integrated circuit including at least a first semiconductor device having a first local interconnect pattern provided such that said first local interconnect pattern bridges across a first conductor pattern forming a part of said first semiconductor device, without contacting with said first conductor pattern, and a second semiconductor device having a second local interconnect pattern provided such that said second local interconnect pattern crosses a second conductor pattern forming a part of said second semiconductor device, with an electrical contact with said second semiconductor device.

Another object of the present invention is to provide a fabrication process of a semiconductor integrated circuit device, comprising the steps of:

(a) forming a conductor film on a substrate;

(b) forming an insulator film on said conductor film to form a layered structure including said conductor film and said insulator film on said substrate;

(c) removing said insulator film selectively from a first part thereof corresponding to a conductor pattern to be formed, while remaining said insulator film on a second part thereof corresponding also to a conductor pattern to be formed;

(d) patterning said layered structure to form a conductor pattern;

(e) providing a side wall insulator to each of said side walls of said conductor pattern;

(f) providing a first local interconnect pattern on said first part of said conductor pattern such that said first local interconnect pattern establishes an electrical connection with said conductor pattern at said first part; and (g) providing a second local interconnect pattern on said second part of said conductor pattern such that said second local interconnect pattern bridges across said conductor pattern at said second part, without establishing electrical connection therewith.

Another object of the present invention is to provide a semiconductor integrated circuit device, comprising:

a substrate;

least a first semiconductor device provided on said substrate, said first semiconductor device having a first local interconnect pattern provided such that said first local interconnect pattern bridges across a first conductor pattern forming a part of said first semiconductor device, without contacting with said first conductor pattern; and a second semiconductor device having a second local interconnect pattern provided such that said second local interconnect pattern crosses a second conductor pattern forming a part of said second semiconductor device, with an electrical contact with said second semiconductor device.

According to the present invention set forth above, it is possible to design a miniature semiconductor integrated circuit with increased flexibility by means of the local interconnect pattern that can bridge across the conductor pattern as necessary. It should be noted also that such a construction that uses local interconnect pattern does not require formation of contact holes and can be miniaturized without being restrained by the tolerance required for such contact holes. By forming silicide on the exposed first part of the conductor pattern, it is possible to increase the operational speed of the semiconductor device. It should be noted that the foregoing steps (f) and (g) are typically carried out simultaneously. Further, the step (c) may be carried out before or after the step (d).

Another object of the present invention is to provide a semiconductor memory integrated circuit device, comprising:

a substrate;

a plurality of memory cells provided on said substrate, each of said memory cells comprising a flip-flop circuit formed of a cross-coupling of first and second inverter circuits; and a complementary logic circuit provided on said substrate and formed of an n-channel MOS transistor and a p-channel MOS transistor;

in each of said plurality of memory cells, each of said first and second inverters including a p-channel MOS transistor and an n-channel MOS transistor connected in series, each of said first and second inverters further including a single semiconductor pattern extending between said p-channel MOS transistor and said n-channel MOS transistor as a gate, said single semiconductor pattern having a work function that is identical in the p-channel MOS transistor and said n-channel MOS transistor that form said first and second inverters;

in said complementary logic circuit, said n-channel MOS transistor and said p-channel MOS transistor having respectively first and second semiconductor strips as a gate electrode, said first semiconductor strip having a work function lower than a work function of said second semiconductor strip;

wherein said first semiconductor strip and said second semiconductor strip are short-circuited, in said complementary logic gate circuit, by a metal compound of a semiconductor material.

According to the present invention, it is possible to decrease, in the complementary logic gate circuit that is required to provide a high operational speed, the threshold voltage for each of the foregoing n-channel as well as p-channel MOS transistors, by using n-type polysilicon having a low work function for the n-channel MOS transistor and simultaneously p-type polysilicon having a higher work function for the p-channel MOS transistor. Thereby, it should be noted that it is possible to provide the p-channel MOS transistor and the n-channel MOS transistor with a sufficient mutual separation. In the complementary logic gate circuit, it should be noted that the demand for high integration density is not so stringent as in the case of memory cell array. Typically, it is possible to separate the p-channel MOS transistor and the n-channel MOS transistor of the complementary logic gate circuit by more than 1 microns without problem. Thereby, the problem of diffusion of dopants from the n-type polysilicon pattern into the p-type polysilicon pattern or vice versa across the metal-semiconductor compound such as silicide formed at the junction between the p-type polysilicon pattern and the n-type polysilicon pattern, is effectively eliminated.

In the semiconductor memory integrated circuit of the present invention set forth above, it should be noted that the p-channel MOS transistors of the first and second inverters forming the memory cell merely act as a load of the n-channel MOS transistors and are not required to have large current driving power. Thus, it is possible to induce the transition of state of the flip-flop circuit with signals having a small logic amplitude by using an n-type polysilicon pattern as the gate electrode of the n-channel MOS transistors of the flip-flop circuit. Thereby, a fast speed writing of information into the memory cell becomes possible. The use of n-type polysilicon pattern for the n-channel MOS transistor connected in series to the n-channel MOS transistor, does not cause the problem of high threshold voltage as noted already, as such a p-channel MOS transistor merely acts as the load of the n-channel MOS transistor. In other words, it is possible to achieve a high integration density for the memory cells by using a single n-type polysilicon pattern extending between the n-channel MOS transistor and the p-channel MOS transistor as the gate electrode.

Other objects and further features of the present invention will become apparent from the detailed description when read in conjunction with the attached drawings.

BRIEF DESCRIPTION OF THE PREFERRED EMBODIMENTS

FIGS. 3A–3F are diagrams showing the fabrication process of a semiconductor integrated circuit according to a second embodiment of the present invention;

FIGS. 13A–13L are diagrams showing the fabrication process of the memory cell of FIG. 7.

DETAILED DESCRIPTION OF THE PREFERRED EMBODIMENTS

FIGS. 2A–2F show the fabrication process of the semiconductor integrated circuit according to a first embodiment of the present invention. The semiconductor integrated circuit may be a memory cell of a CMOS static random access memory as will be described later with reference to other embodiment. However, the semiconductor integrated circuit of the present embodiment is by no means limited to such a CMOS static random access memory.

Figures 2A, 2B:
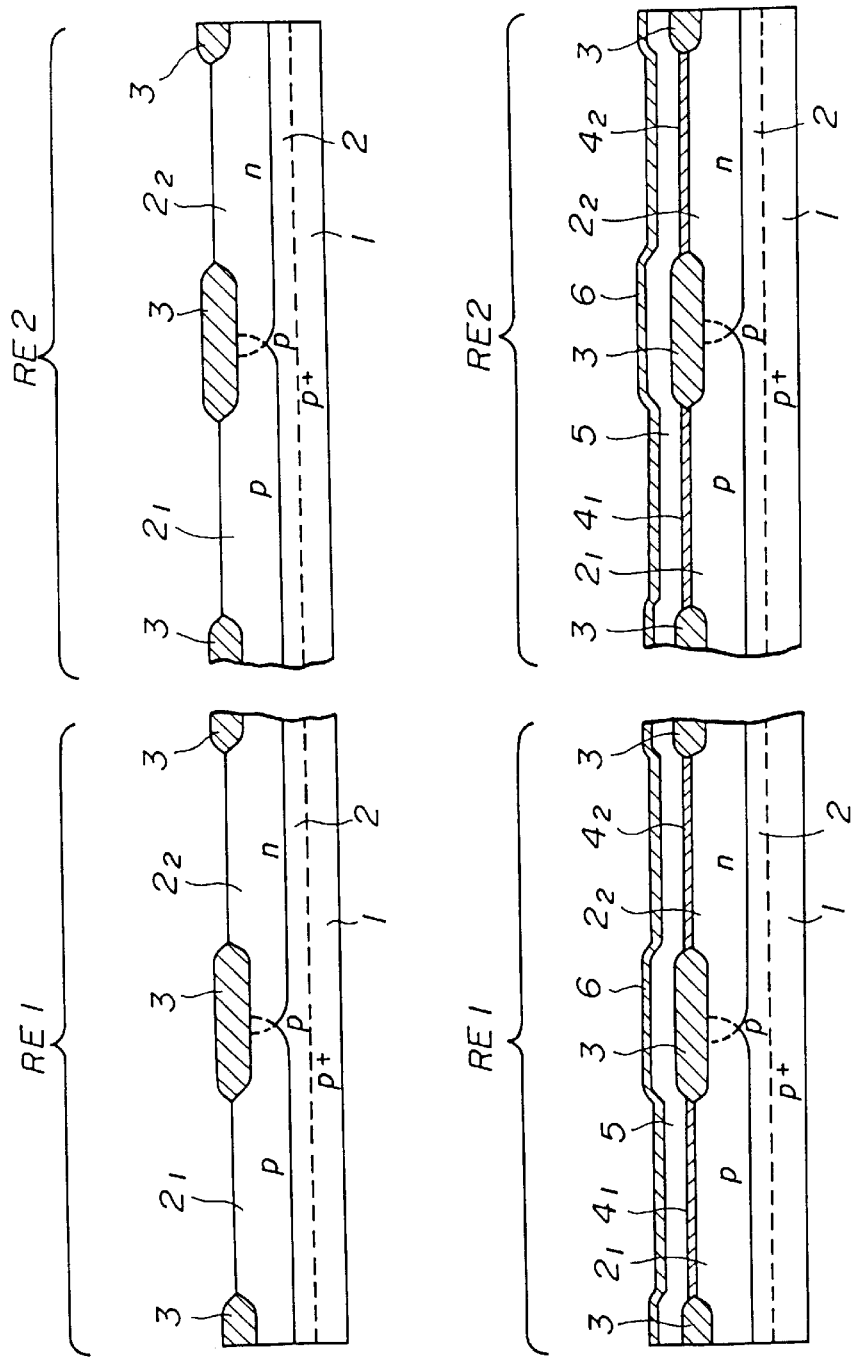
FIGS. 2A–2F are diagrams showing the fabrication process of a semiconductor integrated circuit according to a first embodiment of the present invention.

Referring to FIG. 2A, a p-type silicon layer 2 is deposited on a silicon substrate 1 of the $p^+$-type epitaxially, wherein the substrate 1 includes a first region RE1 and a second region RE2. In each of the regions RE1 and RE2, a field oxide film 3 is provided so as to define an active region in which a p-channel MOS transistor and an n-channel MOS transistor are formed. Further, a p-type well $2_1$ and an n-type well $2_2$ are formed in each of the regions RE1 and RE2, wherein the p-type well $2_1$ serves for the active region of the n-channel MOS transistor while the n-type well $2_2$ serves for the active region of the p-channel MOS transistor.

Next, in the step of FIG. 2B, the surface of the substrate 1 is subjected to a thermal annealing process to form a thin gate oxide film $4_1$ and $4_2$ typically having a thickness of 7 nm in each of the regions RE1 and RE2 respectively in correspondence to the p-type well $2_1$ and the n-type well $2_2$. It should be noted that the gate oxide films $4_1$ and $4_2$ are formed substantially simultaneously as a result of thermal oxidation of the exposed silicon surface. Next, a polysilicon film 5 is deposited over the region RE1 as well as on the region RE2 by a CVD process such that the polysilicon film 5 covers the gate oxide films $4_1$ and $4_2$ and also the field oxide films 3 with a thickness of 250 nm. Further, a silicon oxide film 6 is deposited on the polysilicon film 5 uniformly over the region RE1 and the region RE2 by a CVD process with a thickness of about 180 nm. Thereby, one obtains a structure shown in FIG. 2B.

Figure 2C:
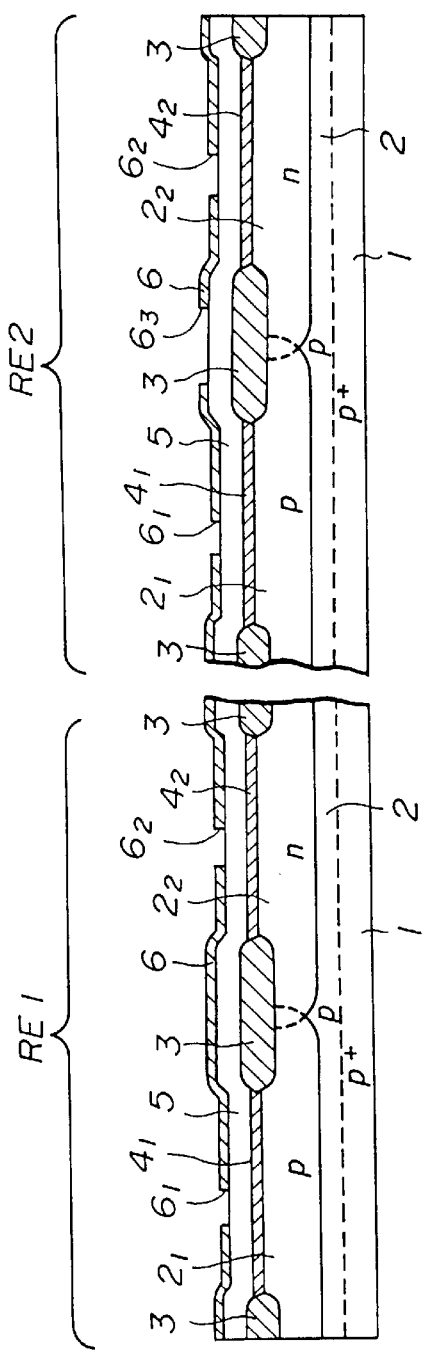

Next, in the step of FIG. 2C, the silicon oxide film 6 is subjected to a patterning process, wherein openings $6_1$ and $6_2$ are formed in each of the regions RE1 and RE2 in correspondence to where a gate electrode of MOS transistor is to be formed. Further, in the region RE2, another opening $6_3$ is formed in correspondence to a field oxide film 3 on which a conductor pattern is formed as will be described below. It should be noted that no such an opening $6_3$ is formed in the region RE1.

Figure 2D:
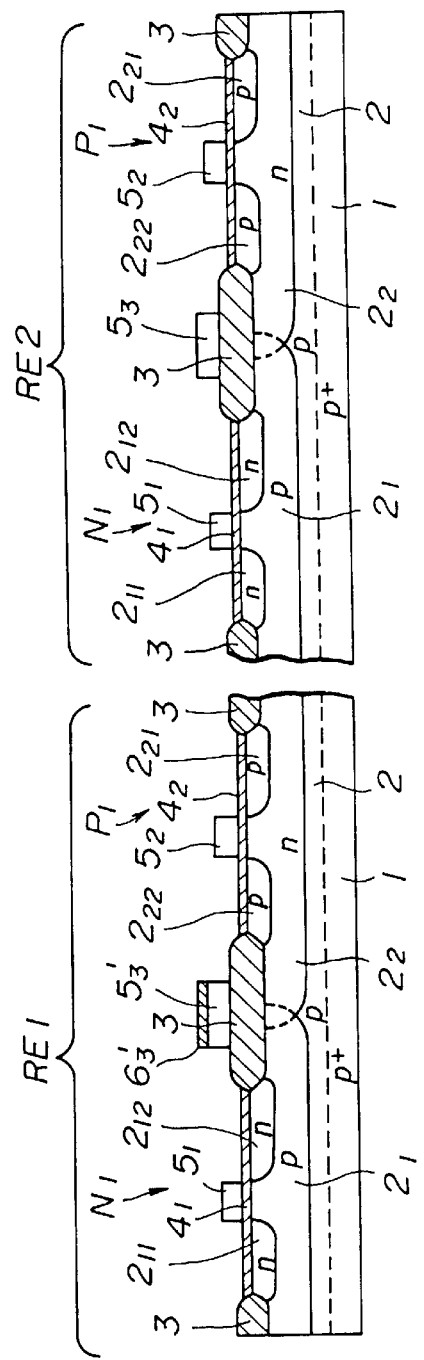

Next, in the step of FIG. 2D, the polysilicon film 5 as well as the silicon oxide film 6 thereon are patterned in both of the region RE1 and the region RE2, such that gate electrodes $5_1$ and $5_2$ are formed in each of the regions RE1 and RE2 in correspondence to the openings $6_1$ and $6_2$. As the gate electrodes $5_1$ and $5_2$ are formed in correspondence to the openings $6_1$ and $6_2$ of the silicon oxide film 6, no silicon oxide film remains on the top surface of the gate electrodes $5_1$ and $5_2$ in each of the regions RE1 and RE2. Similarly, a polysilicon pattern $5_3$ is formed in the region RE2 in correspondence to the opening $6_3$, wherein the polysilicon pattern $5_3$ is free from oxide covering the top surface thereof. On the other hand, in the region RE1, it should be noted that another polysilicon pattern $5_3'$ is formed with a silicon oxide film $6_3'$ covering the top surface of the pattern $5_3'$.

Further, ion implantation processes of n-type dopants and p-type dopants are conducted consecutively into the well $2_1$ and in the well $2_2$ through the gate oxide film $4_1$ or $4_2$, while using the gate electrode $5_1$ or $5_2$ as a self-alignment mask. As a result, n-type diffusion regions $2_{11}$ and $2_{12}$ are formed in the well $2_1$ in each of the regions RE1 and RE2 as source and drain regions. Similarly, p-type diffusion regions $2_{21}$ and $2_{22}$ are formed in the well $2_2$ in each of the regions RE1 and RE2. Thereby, it will be noted that an n-channel MOS transistor N1 is formed in each of the regions RE1 and RE2 in correspondence to the p-type well $2_1$. Similarly, a p-channel MOS transistor P1 is formed in each of the regions RE1 and RE2 in correspondence to the n-type well $2_2$.

Figure 2E:
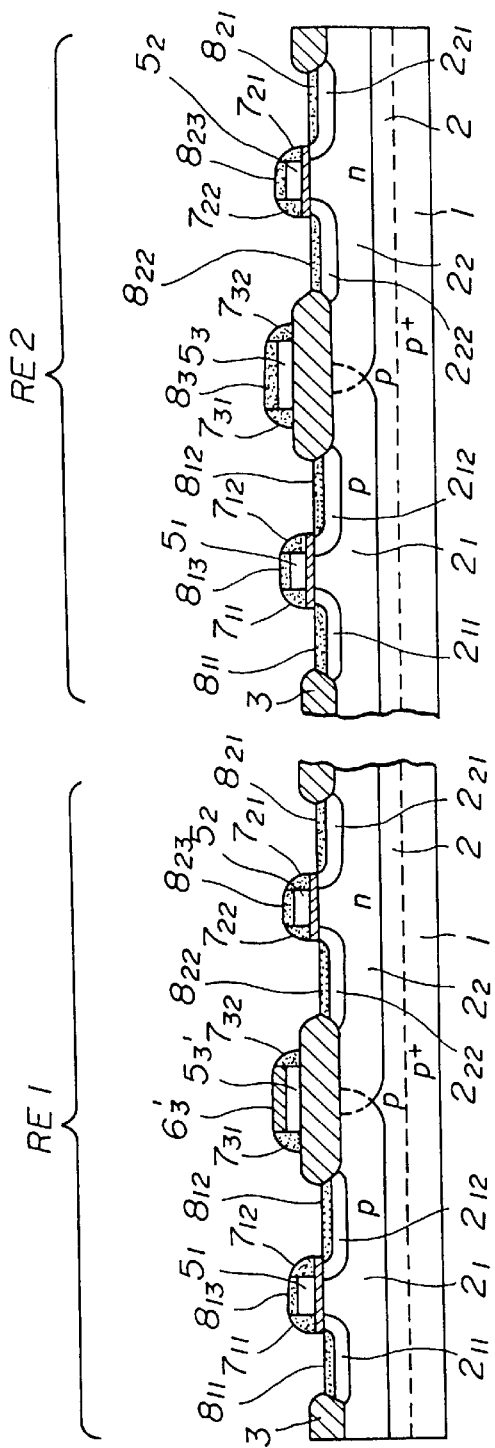

Next, in the step of FIG. 2E, a silicon oxide film is deposited on the structure of FIG. 2D for both the regions RE1 and RE2 by a CVD process typically with a thickness of 100 nm, followed by a reactive ion etching process conducted vertically to the plane of the substrate 1, until the gate oxide film $4_1$ and $4_2$ are removed and the diffusion regions $2_{11}$, $2_{12}$, $2_{21}$ and $22_{22}$ are exposed. In this state, it should be noted that a pair of side wall insulations $7_{11}$ and $7_{12}$ are formed on the gate electrode $5_1$ in each of the regions RE1 and RE2. Similarly, a pair of side wall insulations $7_{21}$ and $7_{22}$ are formed on the gate electrode $5_2$ in each of the regions RE1 and RE2. Further, a pair of side wall insulations $7_{31}$ and $7_{32}$ are formed on the polysilicon pattern $5_3$ in the region RE2 as well as on the polysilicon pattern $5_3'$ in the region RE1.

After the formation of the side wall insulations, a layer of refractory metal (not shown) such as Co, Ti, W, and the like, is deposited on the structure thus obtained, followed by a heat treatment process that causes a reaction with the exposed silicon surface with the refractory metal in the layer to form a silicide such as WSi. As a result of such a reaction, a silicide layer $8_3$ is formed on the exposed top surface of the polysilicon pattern $5_3$ in the region RE2. Similarly, silicide layers $8_{11}$ and $8_{12}$ as well as silicide layers $8_{22}$ and $8_{23}$ are formed in each of the regions RE1 and RE2 on the n-type diffusion regions $2_{11}$ and $2_{12}$ as well as on the p-type diffusion regions $2_{21}$ and $2_{22}$, respectively. It should be noted that no such a silicide layer is formed on the polysilicon pattern $5_3'$ of the region RE1 that is covered by the silicon oxide film $6_3'$. After formation of the silicide layers, the remaining W layer is removed by etching. Thereby, the structure shown in FIG. 2E is obtained.

Figure 2F:
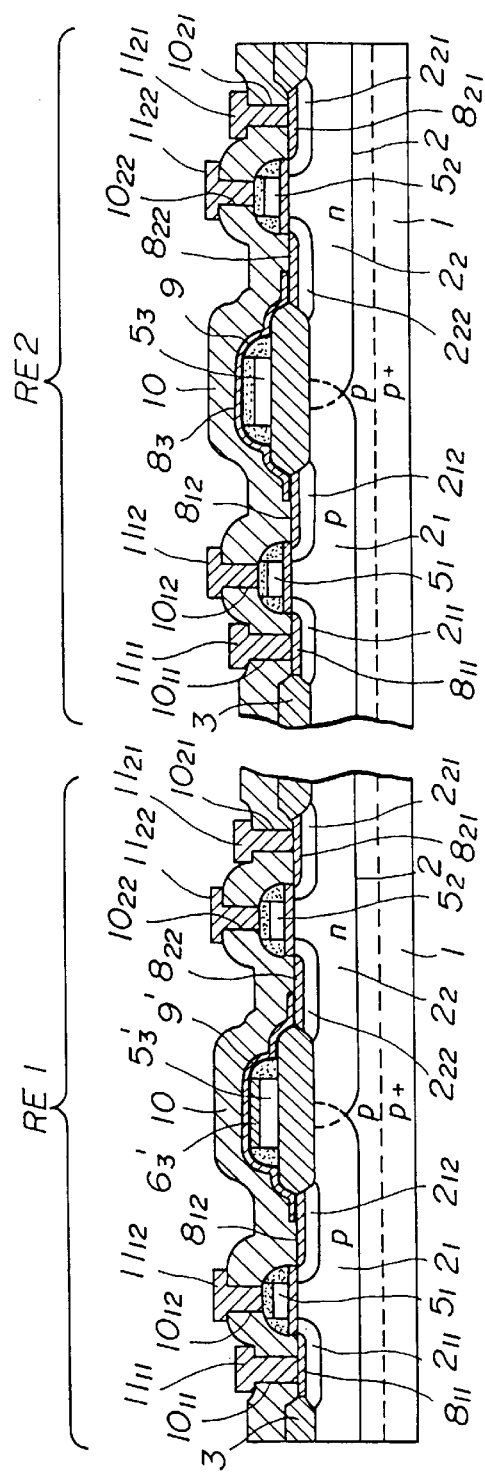

Next, in the step of FIG. 2F, a conductor layer of a refractory metal such as W is deposited on the structure of FIG. 2F, followed by a patterning process to form a local interconnect pattern 9 in the region RE2 as well as a local interconnect pattern 9' in the region RE1. Thereby, it should be noted that the local interconnect pattern 9 of the region RE2 establishes a contact with the exposed silicide layer $8_3$ on the region RE2 as well as with the silicide layers $8_{12}$ and $8_{22}$ and thus connects the diffusion regions $2_{11}$ and $2_{22}$ to the polysilicon pattern $5_3$ electrically. On the other hand, the local interconnect pattern 9' of the region RE1 contacts with the diffusion regions $2_{12}$ and $2_{22}$ in the region RE1 and connects the same with each other electrically, while the pattern 9' bridges across the polysilicon pattern $5_3'$ and hence the silicide region $6_3'$ thereon without contacting therewith.

After the formation of the local interconnect patterns 9 and 9' as such, an interlayer insulation 10 is deposited over the regions RE1 and RE2 uniformly, and contact holds $10_{11}$ and $10_{12}$ as well as contact holds $10_{21}$ and $10_{22}$ are formed in each of the regions RE1 and RE2 respectively in correspondence to the silicide layers $8_{11}$ and $8_{12}$ and the silicide layers $8_{21}$ and $8_{22}$. Further, wiring patterns $11_{11}$ and $11_{12}$ as well as wiring patterns $11_{21}$ and $11_{22}$ are provided in each of the regions RE1 and RE2 respectively in correspondence to the foregoing contact holds $10_{11}$ and $10_{12}$ and the contact holes $10_{21}$ and $10_{22}$.

In the construction of the present invention, therefore, it will be noted that one can provide a local interconnect pattern connected to a polysilicon pattern such as the pattern $5_3$ as well as a local interconnect pattern bridging across a polysilicon pattern such as the pattern $5_3'$ as desired. Thereby, the degree of freedom in designing the integrated circuit increases substantially. The example of forming a CMOS static random access memory integrated circuit according to such a process will be described later with reference to other embodiments. In the present embodiment, it should be noted that the polysilicon pattern $5_3$ and the polysilicon pattern $5_3'$ may form different portions of the same single polysilicon pattern or different polysilicon patterns.

Next, a second embodiment of the present invention will be described with reference to FIGS. 3A–3F, wherein those parts described previously with reference to preceding drawings will be designated by the same reference numerals and the description thereof will be omitted.

Figure 3A:
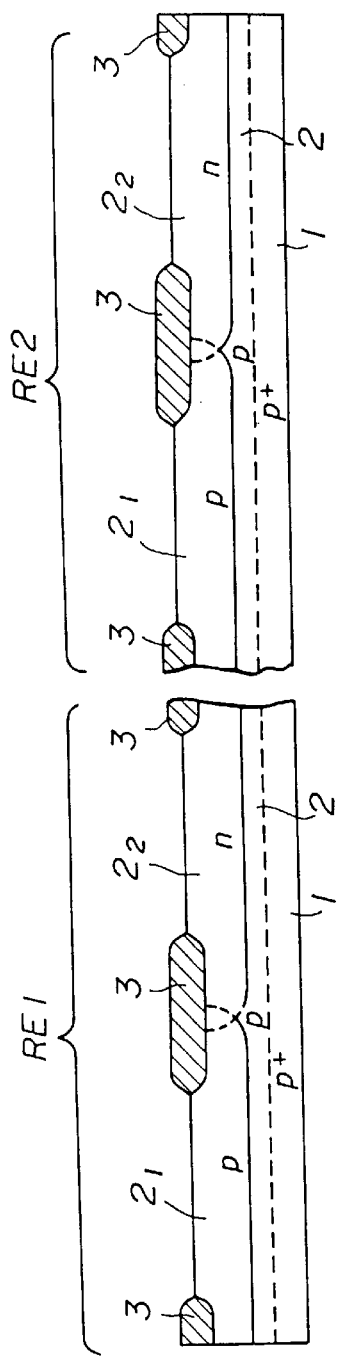
Figure 3B:
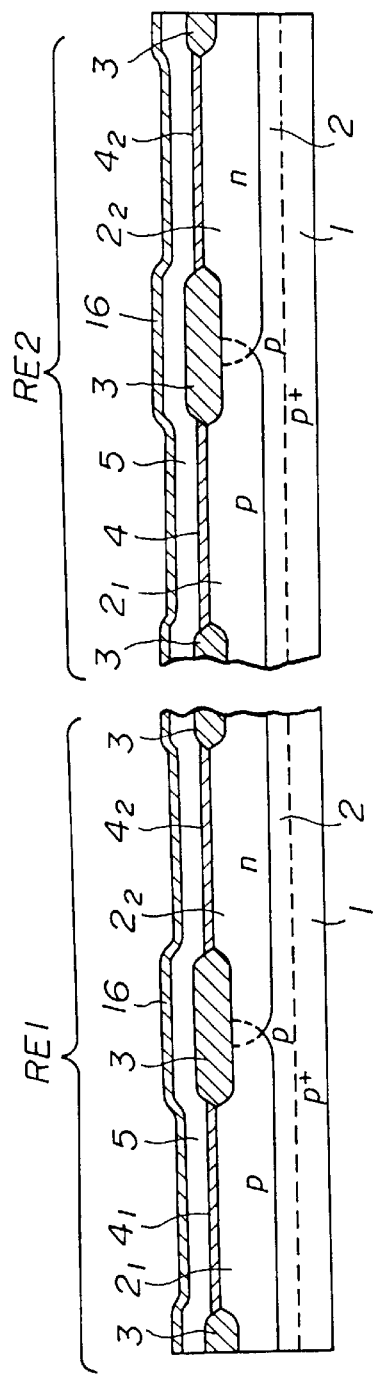

Referring to FIG. 3A, a structure identical to the structure of FIG. 2A is formed, followed by the deposition of the polysilicon layer 5 similarly to the previous embodiment. In the present embodiment, a silicon nitride ($Si_3N_4$) film 16 is provided in place of the silicon oxide film 6 as shown in the structure of FIG. 3B, wherein such a silicon nitride film 16 may be deposited uniformly over the region RE1 as well as on the region RE2 by a CVD process with a thickness of about 100 nm.

Next, in the step of FIG. 3C, the foregoing silicon nitride film 16 is subjected to a patterning process to form silicon nitride patterns $16_1$ and $16_2$ in each of the regions RE1 and RE2 in correspondence to the gate electrodes $5_1$ and $5_2$ to be formed therein. Further, silicon nitride pattern $16_3$ is formed on the field oxide film 3 in the region RE2 in correspondence to the polysilicon pattern $5_3$ to be formed therein, and a silicon nitride pattern $16_3'$ is formed on the field oxide film 3 in the region RE1 in correspondence to the polysilicon pattern $5_3'$ to be formed therein. Further, the polysilicon layer 5 is subjected to patterning by using the silicon nitride patterns $16_1$ and $16_2$ as well as the silicon nitride patterns $16_3$ and $16_3'$ as a mask to form the polysilicon gate electrodes $5_1$ and $5_2$ as well as the polysilicon patterns $5_3$ and $5_3'$.

Next, the silicon nitride patterns are removed from the structure of FIG. 3C except for the polysilicon pattern $16_3'$ by a selective wet etching process, and one obtains the structure of FIG. 3D.

After the structure of FIG. 3C is obtained, ion implantation processes of n-type dopants and p-type dopants are conducted through the gate oxide films $4_1$ and $4_2$ consecutively to form the n-type diffusion regions $2_{11}$ and $2_{12}$ and the p-type diffusion regions $2_{21}$ and $2_{22}$ in each of the regions RE1 and RE2 as indicated in FIG. 3D.

Further, a silicon oxide film (not shown) is deposited on the structure of FIG. 3D uniformly by a CVD process typically with a thickness of 100 nm for both the regions RE1 and RE2, such that the silicon oxide film covers the side walls of the polysilicon patterns $5_1$–$5_3$ as well as the polysilicon pattern $5_3'$. By conducting an RIE process vertically to the principal surface of the substrate 1 such that the thin gate oxide films $4_1$ and $4_2$ are removed and the diffusion regions $2_{11}$ and $2_{12}$ as well as the diffusion regions $2_{21}$ and $2_{22}$ are exposed, one obtains the structure shown in FIG. 3E in which the polysilicon patterns $5_1$–$5_3$ as well as the polysilicon pattern $5_3'$ carry respective side wall insulations $7_{11}$ and $7_{12}$, $7_{21}$ and $7_{22}$ and $7_{31}$ and $7_{32}$.

Figure 3E:
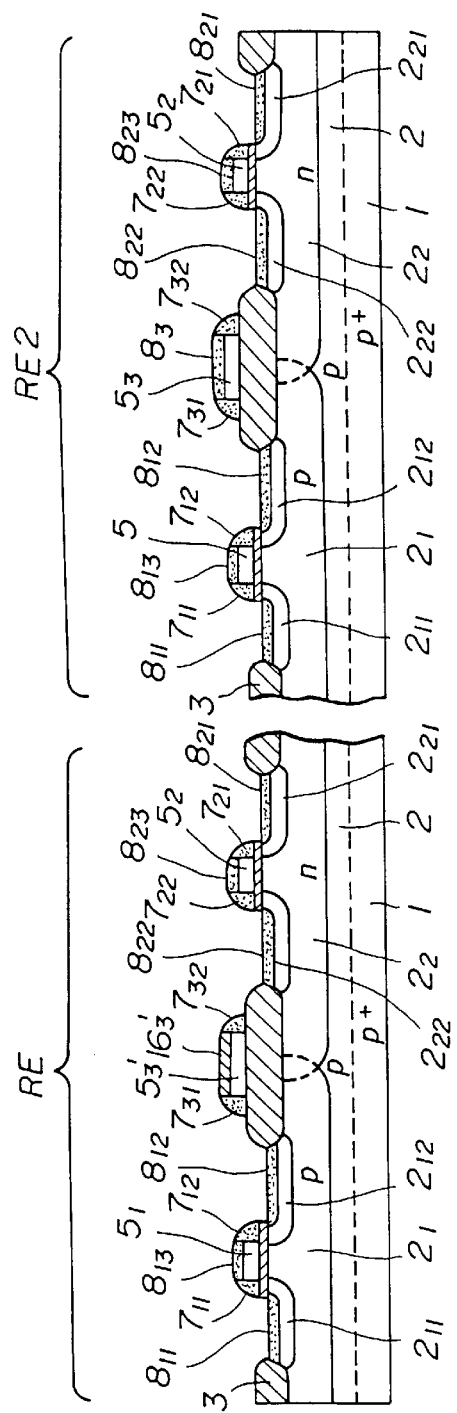

After the side wall insulations are thus formed, a layer of refractory metal such as Co, Ti or W is deposited on the structure of FIG. 3E to cause a reaction with the exposed silicon surface similarly to the first embodiment. Thereby, silicide is formed in the exposed silicon surface as the layers $8_{11}$, $8_{12}$ and $8_{21}$, and $8_{22}$ in correspondence to the diffusion regions $2_{11}$, $2_{12}$ and $2_{21}$, $2_{22}$, for both the regions RE1 and RE2. Thereby, it should be noted that such a formation of silicide occurs in the polysilicon pattern $5_3$ of the region RE2, while no such formation of silicide occurs in the polysilicon pattern $5_3'$ in the region RE2. It should be noted that the polysilicon pattern $5_3'$ is covered by the silicon nitride pattern $16_3'$ and is protected from the reaction that forms silicide. Thus, the structure shown in FIG. 3E is obtained, after removing the unreacted conductor pattern.

After the structure of FIG. 3E is thus formed, the structure of FIG. 3F is obtained similarly to the process of FIG. 2F.

In the process of the present embodiment, it should be noted that the removal of the silicon nitride pattern in the step of FIG. 3D is conducted without causing a damage to the underlying field oxide film 3 as a result of selective wet etching process. Further, it should be noted that the present embodiment indicates that the selective removal of the silicon nitride pattern such as the pattern $16_3$ can be conducted after the patterning of the polysilicon patterns $5_1$–$5_3$ and $5_3'$.

Next, a third embodiment of the present invention will be described with reference to FIGS. 4A–4C, wherein only essential part will be described.

Figure 4A:
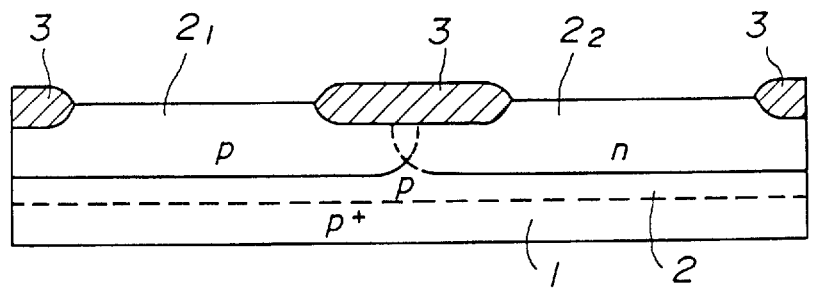
FIGS. 4A–4C are diagrams showing the fabrication process of a semiconductor integrated circuit according to a third embodiment of the present invention.
Figure 4B:
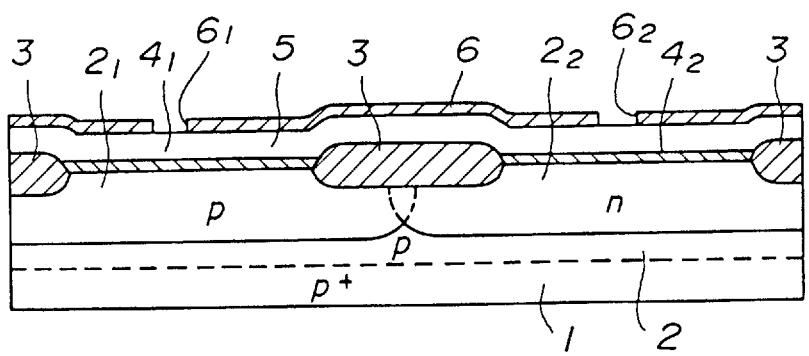

Referring to FIG. 4A, a structure identical with the structure of FIG. 2A is obtained, and the polysilicon layer 5 and the silicon oxide film 6 are formed consecutively on the structure of FIG. 4A as indicated in FIG. 4B, wherein the silicon oxide film 6 is further subjected to a patterning process and one obtains a structure identical with the structure of FIG. 2C.

Figure 4C:
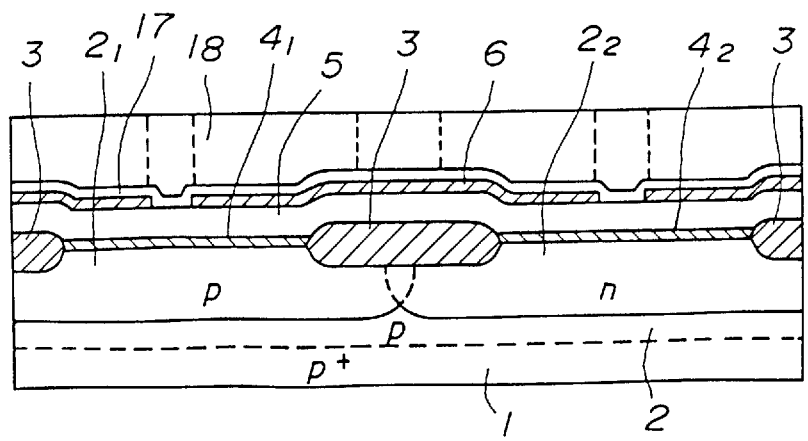

In the present embodiment, an anti-reflection film 17 of amorphous carbon and a photoresist layer 18 are deposited consecutively on the structure of FIG. 4B as indicated in FIG. 4C, wherein the photoresist layer 18 is further subjected to an exposure process for exposing the region thereof indicated in FIG. 4C by broken lines to an optical beam of a KrF excimer laser having a wavelength of 248 nm. It should be noted that the foregoing radiation of KrF excimer laser experiences substantially no absorption in the silicon oxide film 6. The exposed part of the photoresist 18 thereby forms a resist pattern after development and is used as a mask when patterning the polysilicon patterns $5_1$–$5_3$ as well as $5_3'$.

In the present embodiment, it should be noted that the anti-reflection film 17 is provided to increase the accuracy of exposure by eliminating formation of standing wave, which is caused by the interference of exposure optical beam and the reflection beam reflected from the silicon oxide film 6 or from the exposed part of the polysilicon layer 5. Typically the anti-reflection film 17 is formed by depositing amorphous carbon having a refractive index of 1.58 and absorption coefficient of 0.75 by a CVD process with a thickness of 45 nm.

While such an anti-reflection film is used commonly in the photolithographic patterning process, the structure of FIG. 4C that includes openings formed in the silicon oxide film 6 raises a problem in that the phase and intensity of the reflected optical beam changes in the region where the silicon oxide film 6 is formed and in the region where the surface of the polysilicon layer 5 is exposed. Thereby, mere use of the anti-reflection film 17 does not result in the desired improvement of accuracy of the exposure.

In order to eliminate the foregoing problem, the present embodiment sets the thickness of the silicon oxide film 46 to be one-half the wavelength of the optical beam emitted from the KrF excimer laser. In other words, the present embodiment forms the silicon oxide film 6 to have a thickness of 84 nm. It should be noted that the wavelength of the light propagating through a medium is given by the wavelength in the vacuum divided by the refractive index of the medium. In the present case, the silicon oxide film 6 has a refractive index of 1.48, and thus, the wavelength of the light in the silicon oxide film 46 is given as 248 nm/1.48≈168 nm.

By doing so, the optical beam reflected at the polysilicon film 5 after passing through the silicon oxide film 6 in the direction toward the polysilicon film 5 and further passed through the silicon oxide film 6 in the direction away from the polysilicon layer 5, has the phase and intensity substantially identical with the optical beam reflected at the exposed surface of the polysilicon layer 5. Thereby, the cancellation of the standing wave by the anti-reflection film occurs just the same in the exposed region of the polysilicon layer 5 as in the region of the polysilicon layer 5 covered by the silicon oxide film 6. It should be noted that the foregoing refractive index and the thickness of the amorphous carbon anti-reflection film 17 are optimized for efficient cancellation of such a standing wave throughout the substrate irrespective of whether or not there is an opening for exposing the surface of the polysilicon layer 5. From the explanation above, it will also be noted that the thickness of the silicon oxide film 6 is not limited to one-half of the wavelength of the exposure optical beam but may also be an integer multiple of one-half of the exposure optical beam wavelength.

In the foregoing embodiments, one may provide an insulation film (not shown) on the entire surface of the structure of FIG. 2E, after formation of the side wall insulations $7_{11}$ and $7_{12}$, $7_{21}$ and $7_{22}$, or $7_{31}$ and $7_{32}$. In this case, the insulation film is further formed with a groove exposing the diffusion regions $2_{11}$, $2_{12}$, $2_{21}$ and $2_{22}$ as well as the gate electrodes $5_1$ and $5_2$ and further the polysilicon pattern $5_3$ except for the polysilicon pattern $5_3'$, and a refractory metal layer such as W is deposited on the entire surface of the insulation film so as to fill the groove on the insulation film. Further, the refractory metal layer remaining on the insulation film is removed by a chemical mechanical polishing (CMP) process such that the refractory metal layer remains only in the grooves thus formed as the local interconnect pattern. Such a so-called damascene process is applicable also to the second embodiment of the present invention.

Next, the fabrication of a CMOS static random access memory using the foregoing fabrication process of integrated circuit will be described in detail with reference to a fourth embodiment of the present invention.

A semiconductor memory integrated circuit generally includes a memory cell array for storing information and a logic circuit for selecting a memory cell transistor in the memory cell array, on a common substrate. In the state of the art miniature semiconductor integrated circuits, low supply voltages are commonly used in correspondence to the increasing degree of miniaturization of the individual devices, in view of reliability problem caused by hot carriers. On the other hand, use of such a low supply voltage results in a decrease in the logic amplitude of the signals used in the integrated circuit. In order to achieve desired increase of operational speed, therefore, it is necessary to decrease the threshold voltage of the MOS transistors in correspondence to the decrease in the supply voltage.

In the complementary CMOS logic gates including an n-channel MOS transistor and a p-channel MOS transistor and is used conventionally in semiconductor memory integrated circuits, it has been practiced to use an n-type polysilicon pattern as the gate of both the n-channel MOS transistor and the p-channel MOS transistor. When using such an n-type polysilicon for the gate electrode of a n-channel MOS transistor, it has been practiced to employ the so-called buried channel construction for reducing the threshold of the transistor, wherein such a buried channel construction forms a conductive region in the surface part of the channel by implementing a doping of impurities. In the p-channel MOS transistor, for example, a p-type region is formed in the surface part of the n-type channel by means of ion implantation of p-type impurities.

Figure 5A:
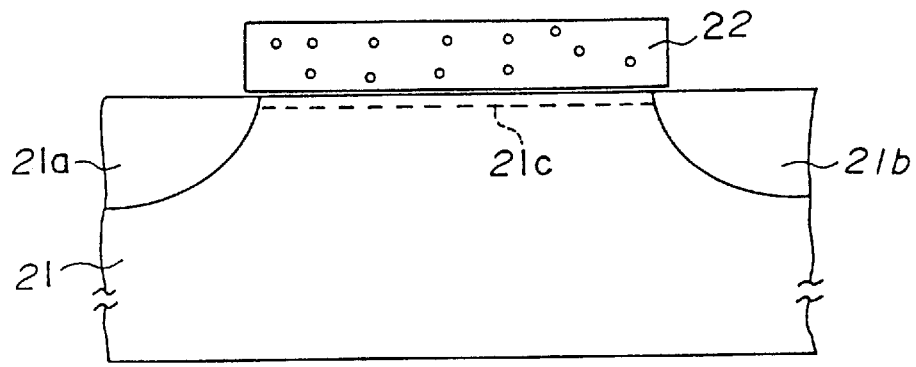
FIGS. 5A and 5B are diagrams showing the construction of conventional MOS transistors.

FIG. 5A show an example of the MOS transistor having a buried channel.

Referring to FIG. 5A, the transistor is formed on an n-type silicon substrate 21 and includes a source region 21*a* of $p^+$-type and a drain region 21*b* also of $p^+$-type separated from the source region 21*a* by a channel region 21*c*. Further, the MOS transistor includes a gate electrode 22 of $n^+$-type polysilicon formed on the foregoing channel region with a separation therefrom by a gate oxide film of which illustration is omitted. Further, the substrate 21 includes a p-type surface region in correspondence to the foregoing channel region 21c.

When such a MOS transistor having the buried channel construction is used for an integrated circuit, however, there arises a problem of short channel effect in which the electric field caused by the drain voltage applied to the drain region 21b invades into the channel region 21c and modifies the threshold of the transistor. Thus, the attempt to increase the drain current by employing the buried channel construction that decreases the threshold voltage of the transistor, inevitably raises a problem of poor suppression of the short channel effect particularly when the drain current is increased as a result of decrease of the threshold voltage.

Figure 5B:
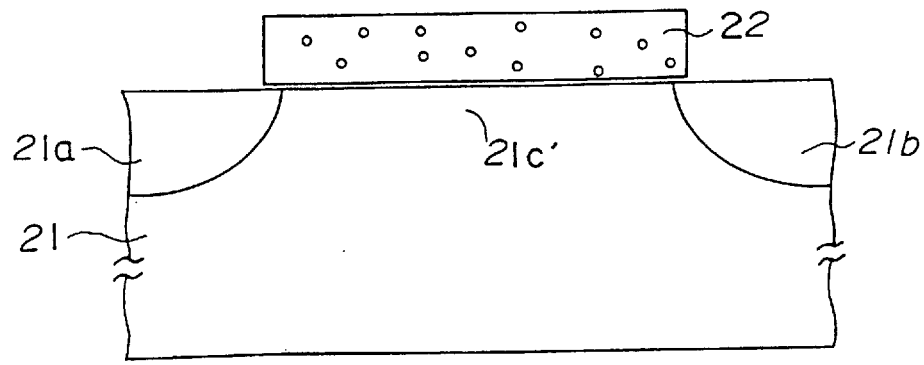

In order to eliminate such a problem pertinent to the logic gate having the buried-channel structure, it has been proposed to use a so-called dual gate MOS transistor shown in FIG. 5B wherein n-type polysilicon is used for the gate of the n-channel MOS transistor and p-type polysilicon is used for the gate of the p-channel MOS transistor, wherein FIG. 5B shows only a channel region 21c' on the surface of the n-type silicon substrate 21.

Generally, the threshold voltage $V_{TH}$ of a n-channel MOS transistor is given as $$V_{TH}=(\phi_M-\phi_S)+2\phi_B+\sqrt{[2\epsilon_s qN(2\phi_B+V_{BS})]}/C_{ox}, \quad (1)$$

while the threshold voltage of a p-channel MOS transistor is given as $$V_{TH}=(\phi_M-\phi_S)+2\phi_B-\sqrt{[2\epsilon_s qD(2\phi_B+V_{BS})]}/C_{ox}, \quad (2)$$

wherein $\phi_M$ represents the work function of the gate electrode, $\phi_S$ represents the work function of the substrate, $\phi_B$ represents the Fermi potential of the substrate, $\epsilon_s$ represents the elemental electric charge, N represents the acceptor concentration of the n-channel MOS transistor, D represents the donor concentration of the p-channel MOS transistor, $V_{BS}$ represents the substrate bias voltage, and $C_{ox}$ represents the electrostatic capacitance of the gate oxide for a unit area.

Referring to Eqs. (1) and (2), it will be noted that the first term of the Eq. (1) becomes negative when $n^+$-type polysilicon is used on the p-type substrate as the gate of an n-channel MOS transistor, and the magnitude of the threshold voltage $V_{TH}$ decreases as a result of cancellation of the negative first term cancels with the third term of Eq. (3). Similarly, the use of $^+$-type polysilicon in a p-channel MOS transistor causes a decrease in the magnitude of the threshold voltage $V_{TH}$ as a result of cancellation of the first term and the third term of Eq. (2).

While the foregoing theoretical explanation applies to the buried channel MOS transistor of FIG. 5A as well as to the dual gate MOS transistor of FIG. 5B, it should be noted that, in the case of the dual gate MOS transistor of FIG. 5B, the formation of depletion region associated with the p-n junction between the drain region 21b and the channel region 21c' reduces the short channel effect substantially. Thus, it is expected that the dual gate MOS transistor of FIG. 5B is suitable for reducing the short channel effect.

When forming a general integrated circuit including the p-channel MOS transistor and the n-channel MOS transistor having the dual gate structure on a common substrate, however, one encounters a problem in that a p-n junction is inevitably formed in a polysilicon pattern forming the gate electrode of the MOS transistors, as the polysilicon pattern is doped to the $p^+$-type in the region of the p-channel MOS transistor and to the $n^+$-type in the region of the n-channel MOS transistor. It should be noted that such a p-n junction causes a rectification of the signals on the polysilicon pattern, while such a rectification tends to invite unstable operation of the integrated circuit. In order to avoid such a problem of instable operation, it is necessary to provide different gate electrode patterns for the p-channel MOS transistor and the n-channel MOS transistor, while such a construction increases the complexity of the interconnect pattern and disadvantageous in view point of fabrication cost and integration density.

It should be noted that such a p-n junction can be eliminated by forming a silicide of refractory metal in correspondence to the part of the gate pattern on which the p-n junction is formed. Thus, it should be noted that the fabrication process of integrated circuit that uses a local interconnect pattern contacting with a silicide region as described with reference to preceding first through third embodiments, is thought suitable for fabricating such a memory cell of CMOS static random access memory integrated circuit.

When employing a polysilicon pattern carrying thereon a silicide region as set forth in previous embodiments, it is necessary to provide a sufficient separation between the n-channel MOS transistor and the p-channel MOS transistor connected with each other and to minimize the thermal treatment in view of very large diffusion coefficient of impurity elements in silicides. In silicides, the impurities generally have a diffusion coefficient larger than the diffusion coefficient in silicon by several orders. For example, when Co silicide is formed at the junction of a p-type polysilicon pattern and an n-type polysilicon pattern as a result of annealing process conducted at 800° C. for 30 seconds, it is necessary to set a separation between the p-channel MOS transistor and the n-channel MOS transistor to be at least 1.0 $\mu$m, preferably more than 2.0 $\mu$m. However, such an increased separation between the transistors inevitably results in a decrease in the integration density of the integrated circuit.

Thus, the present embodiment provides a CMOS static random access memory having a complementary logic gate circuit formed of MOS transistors that have a low threshold voltage and a memory cell array having a large integration density. More specifically, the present embodiment provides a CMOS static random access memory including a substrate, a plurality of memory cells provided on the substrate, each of the memory cells including a flip-flop circuit formed of a cross-coupling of first and second inverter circuits, and a complementary logic gate circuit provided on the substrate and formed of an n-channel MOS transistor and a p-channel MOS transistor, wherein each of the first and second inverters includes, in each of the plurality of memory cells, a p-channel MOS transistor and an n-channel MOS transistor connected in series. Each of the first and second inverters further includes a single semiconductor pattern extending between the p-channel MOS transistor and the n-channel MOS transistor as a gate, wherein the single semiconductor pattern has a work function that is identical in the p-channel MOS transistor and the n-channel MOS transistor that form the first and second inverters. Further, the n-channel MOS transistor and the p-channel MOS transistor forming the complementary logic gate circuit have respectively first and second semiconductor patterns as a gate, wherein the first semiconductor pattern has a work function lower than a work function of the second semiconductor pattern. Further, the first semiconductor pattern and the second semiconductor pattern are short-circuited, in the complementary logic gate circuit, by a metal compound of the semiconductor material.

In the present invention, it is possible to decrease, in the complementary logic gate circuit that is required to provide a high operational speed, the threshold voltage for each of the n-channel and p-channel MOS transistors, by using n-type polysilicon having a low work function for the n-channel MOS transistor and simultaneously p-type polysilicon having a low work function for the n-channel MOS transistor and simultaneously p-type polysilicon having a higher work function for the p-channel MOS transistor. Thereby, it should be noted that it is possible to provide the p-channel MOS transistor and the n-channel MOS transistor with a sufficient mutual separation. In the complementary logic gate circuit, it should be noted that the demand for high integration density is not so stringent as in the case of memory cell array. Typically, it is possible to separate the p-channel MOS transistor and the n-channel MOS transistor of the complementary logic gate circuit by more than 1 microns without problem. Thereby, the problem of diffusion of dopants from the n-type polysilicon pattern into the p-type polysilicon pattern or vice versa across the metal-semiconductor compound such as silicide formed at the junction between the p-type polysilicon pattern and the n-type polysilicon pattern, is effectively eliminated.

In the CMOS static random access memory of the present invention, it should be noted that the p-channel MOS transistors of first and second inverters forming the memory cell merely act as a load of the n-channel MOS transistors and are not required to have large current driving power. Thus, it is possible to induce the transition of state of the flip-flop circuit with signals having a small logic amplitude by using an n-type polysilicon pattern as the gate electrode of the n-channel MOS transistors of the flip-flop circuit. Thereby, a fast speed writing of information into the memory cell becomes possible. The use of n-type polysilicon pattern for the p-channel MOS transistor connected in series to the n-channel MOS transistor does not cause a problem as noted already, as such a p-channel MOS transistor merely acts as the load of the n-channel MOS transistor. In other words, it is possible to achieve a high integration density for the memory cells by using a single n-type polysilicon pattern extending between the n-channel MOS transistor and the p-channel MOS transistor as the gate electrode.

Figure 6:
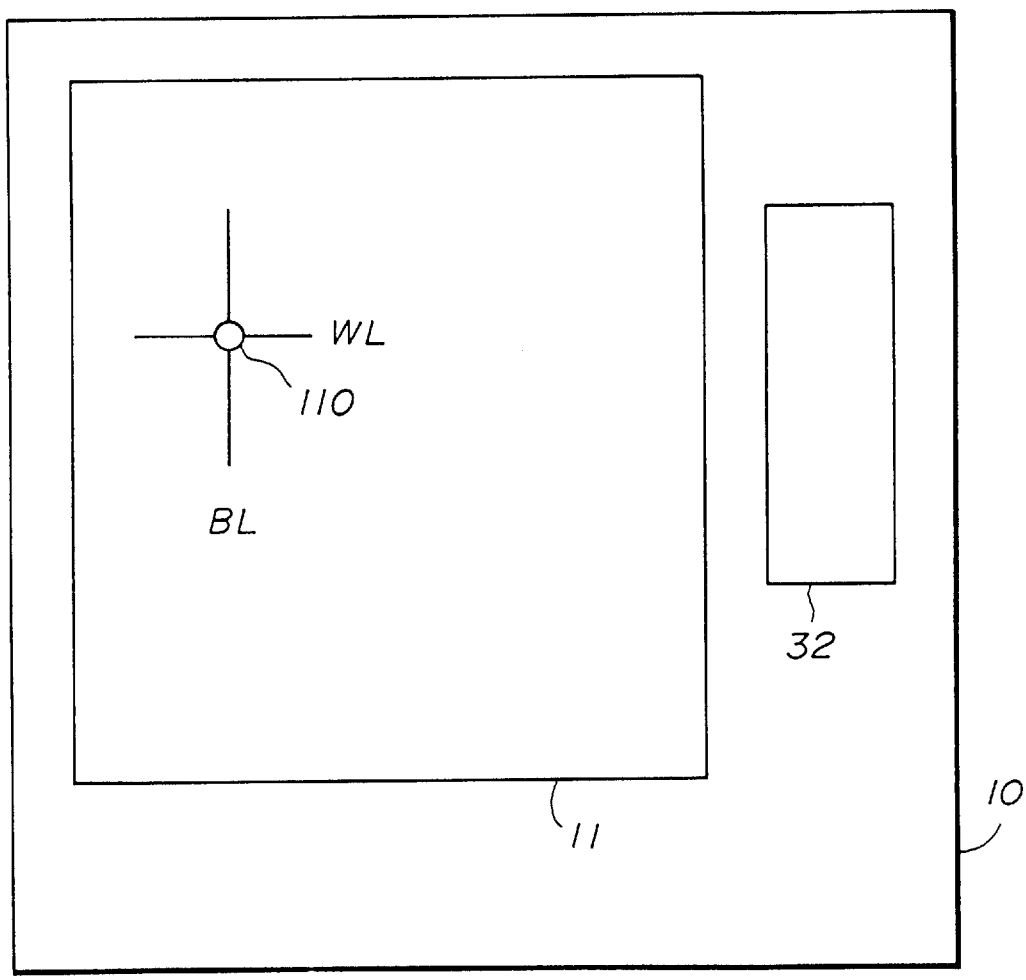
FIG. 6 is a diagram showing the general construction of a CMOS static random access memory according to a fourth embodiment of the present invention.

FIG. 6 shows the overall construction of the CMOS static random access memory of the present embodiment in a plan view.

Figure 1A:
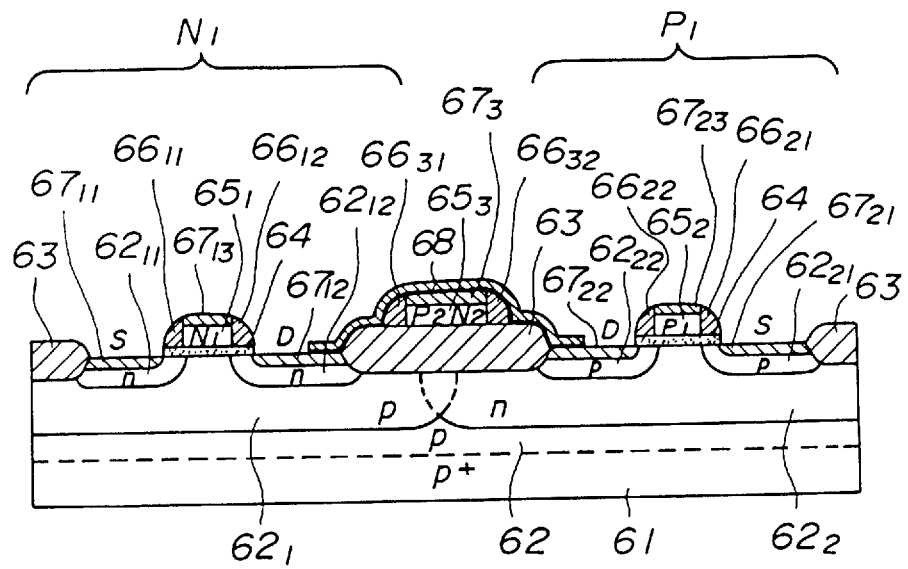
FIGS. 1A and 1B are diagrams showing the construction of a conventional CMOS circuit that uses a local interconnect pattern.
Figure 1B:
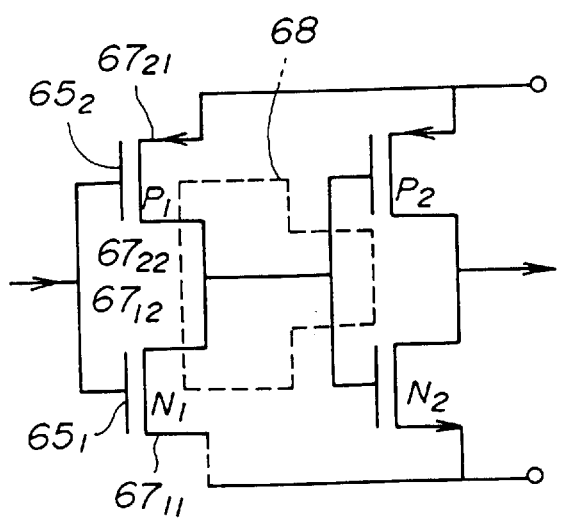

Referring to FIG. 1, the CMOS static random access memory is constructed on a silicon substrate 30 and includes a memory cell array 31 formed of a number of memory cells 110 arranged in a row and column formation on the substrate 30 for storing information, and a peripheral circuit 32 provided also on the substrate 30 for selecting a memory cell 110 in the memory cell array 31 for reading and/or writing information from and to the selected memory cell 110. For example, the peripheral circuit 32 includes a decoder supplied with address data for selecting a corresponding bit line BL or word line WL, a sense amplifier for reading data read out from a selected memory cell 110 via a corresponding bit line BL, and the like. Generally, the memory cell array 31 is required to have a high integration density, while the peripheral circuit 32 is required to have a high operational speed.

Figure 7:
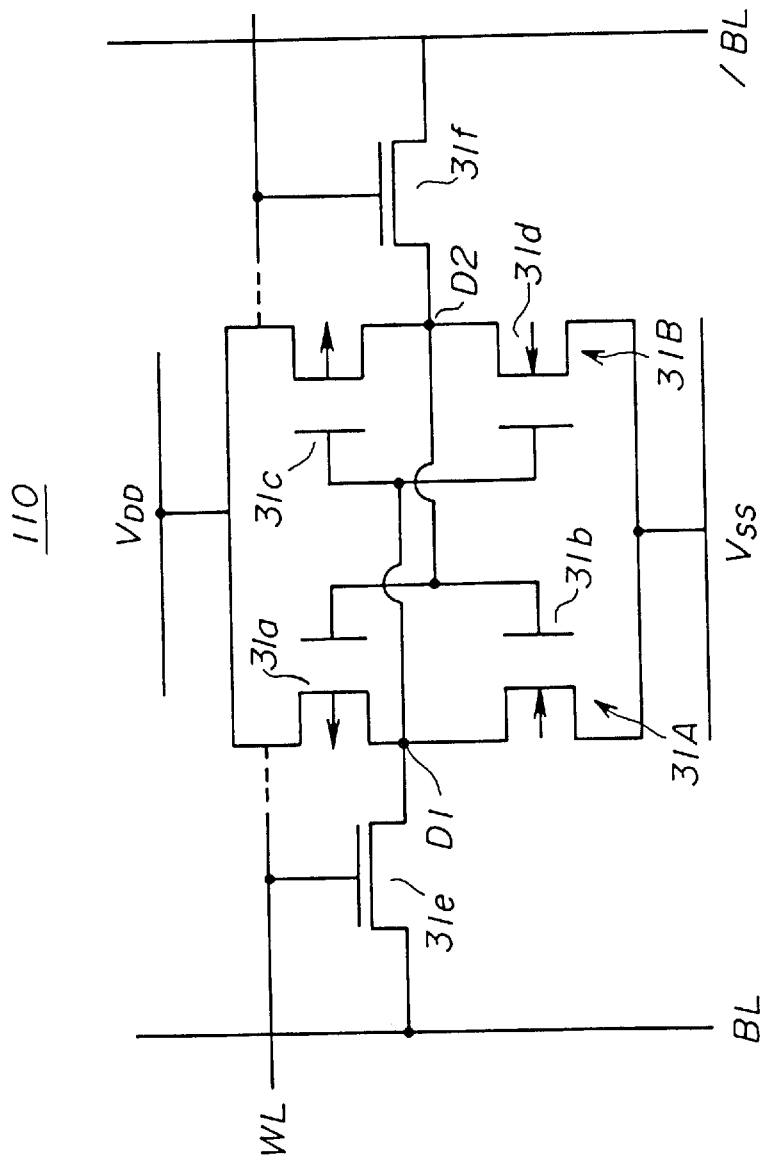
FIG. 7 is a circuit diagram showing the construction of a memory cell of the CMOS static random access memory of FIG. 6.

FIG. 7 shows the construction of a memory cell 110 forming the memory cell array 31 of FIG. 6.

Referring to FIG. 7, the memory cell 110 is formed of a cross connection of a first inverter 31A that includes a p-channel MOS transistor 31a and an n-channel MOS transistor 31b connected in series and a second inverter 31B that includes a p-channel MOS transistor 31c and an n-channel MOS transistor 31d connected in series, wherein it will be noted that the inverters 31A and 31B form a flip-flop circuit as usual. Thus, the transistors 31a and 31b have respective gates connected commonly to a common node D2 of the transistors 31c and 31d, while the transistors 31c and 31d have respective gates connected commonly to a common node D1 of the transistors 31a and 31b.

As usual in static random access memories, the node D1 is connected to a bit line BL via a n-channel MOS transistor 31e while the node D2 is connected to a complementary bit line /BL via a n-channel MOS transistor 31f, wherein the transistors 31e and 31f are controlled by a corresponding word line WL. Thus, the activation of a word line WL causes a selection of a memory cell 110, and data is supplied to the memory cell 110 thus selected via corresponding bit lines BL and /BL, wherein the data thus supplied includes a transition of the state of the flip-flop circuit that forms the memory cell 110. When reading information, on the other hand, the word line WL corresponding to the selected memory cell is activated, and the state of the flip-flop circuit forming the memory cell is detected by detecting the voltages appearing on the nodes D1 and D2 by a sense amplifier included in the peripheral circuit 32 via the bit lines BL and /BL.

In the flip-flop circuit formed of such a cross connection of the inverters 31A and 31B, it should be noted that the bit line voltage on the bit lines BL and /BL drives only the n-channel MOS transistors 31b and 31d, while the p-channel MOS transistors 31a and 31c merely form a load of the respective n-channel MOS transistors 31b and 31d. In other words, it is essential for the high speed writing of information into such a memory cell that the n-channel MOS transistors 31b and 31d have a low threshold voltage. On the other hand, the p-channel MOS transistors 31a and 31c are not necessarily required to have a low threshold voltage. Rather, the memory cell 110 is required to have as much as simple layout in order to achieve a high integration density.

The peripheral circuit 32, on the other hand, is required to have as much as high operational speed in order to realize high speed access. It should be noted that the peripheral circuit 32 generally includes decoders and latch circuits supplied with address data for selecting a corresponding word line or a bit line, or sense amplifiers, while such circuits forming the peripheral circuit 32 are formed of complementary logic gates of which construction is shown in FIG. 8.

Figure 8:
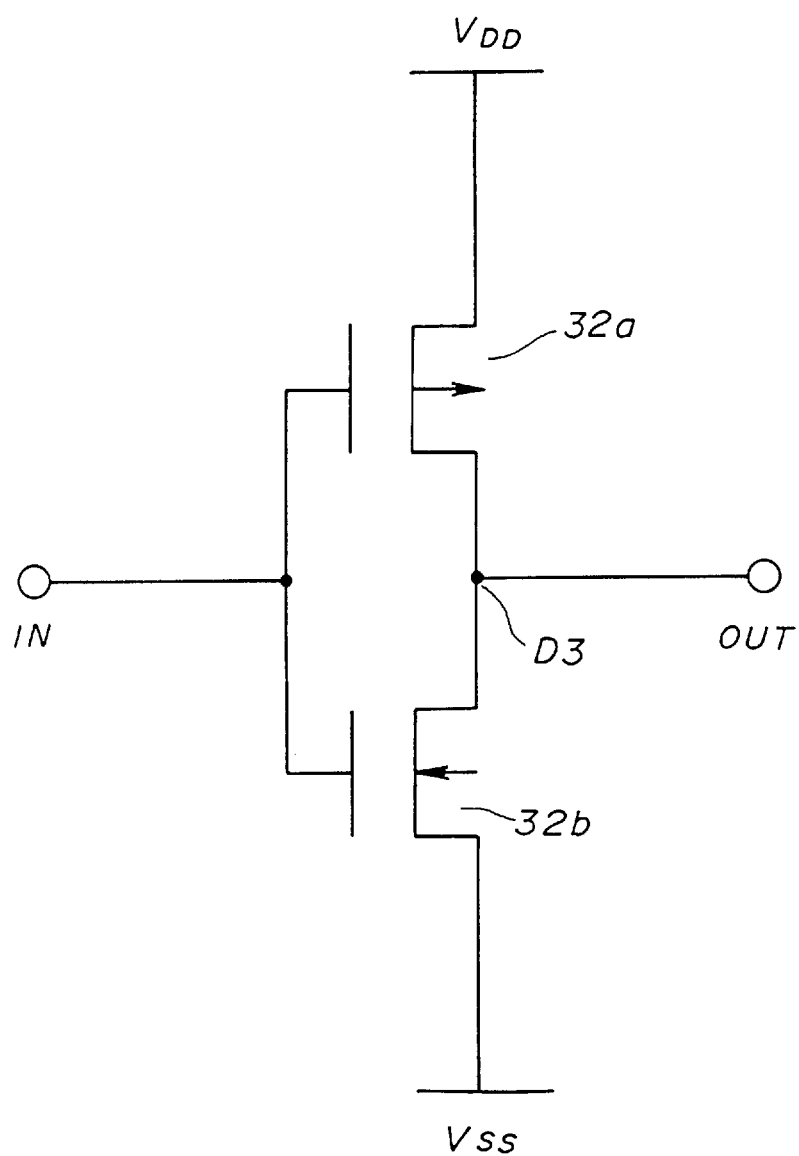
FIG. 8 is a circuit diagram showing the construction of a complementary logic gate forming a part of the CMOS static random access memory of FIG. 6.

Referring to FIG. 8, the complementary logic gate is formed of an inverter 120 including a p-channel MOS transistor 32a and an n-channel MOS transistor 32b connected in series, wherein the transistors 32a and 32b have respective gates connected commonly to an input terminal IN. Further, a common node D3 of the transistors 32a and 32b are connected to an output terminal OUT.

Figure 9:
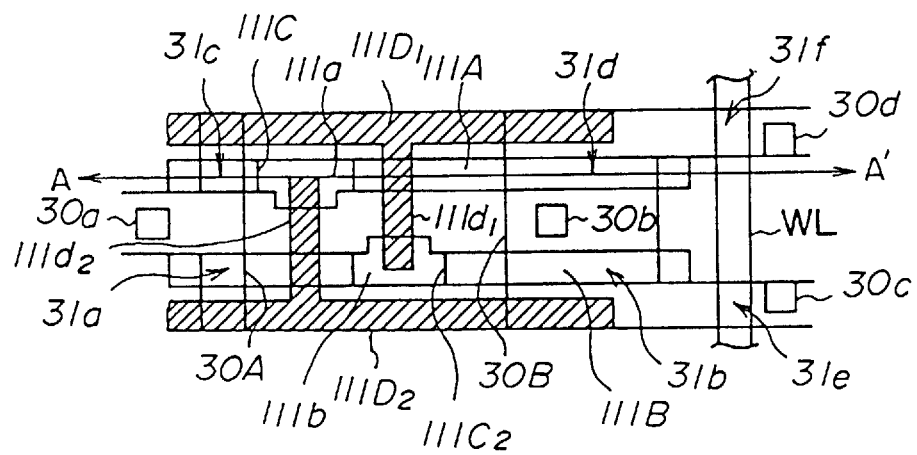
FIG. 9 is a diagram showing the layout of the memory cell of FIG. 7 in a plan view.
Figure 10:
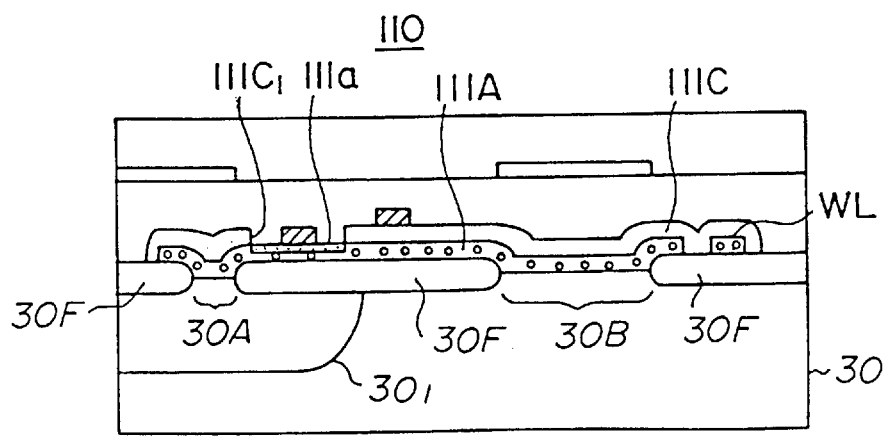
FIG. 10 is a cross sectional view of the memory cell of FIG. 7 along a line A—A' of FIG. 9.

FIG. 9 shows the layout of the memory cell 110 shown in FIG. 6 and FIG. 10 shows a cross section of the structure of FIG. 9 taken along a line A—A' shown in FIG. 9, wherein it should be noted that FIGS. 9 and 10 show only the flip-flop part of the memory cell 110.

Referring to FIG. 9, the silicon substrate 30 is doped to the p-type and is covered by a field oxide film 30F not shown in FIG. 9 (see FIG. 10), wherein the field oxide film 30F defines a T-shaped active region 30A and a U-shaped active region 30B in correspondence to the memory cell 110. It should be noted that the active region 30A is formed in an n-type well $30_1$ that in turn is formed in the p-type substrate 30 as indicated in the cross section of FIG. 5.

Further, the field oxide film 30F carries thereon a pair of generally parallel polysilicon patterns 111A and 111B such that the polysilicon pattern 111A establishes a contact with a surface of the substrate 30 at a contact hole provided in correspondence to the active regions 30A and 30B. Similarly, a polysilicon pattern 111B establishes a similar contact with the surface of the substrate 30. Further, it should be noted that a polysilicon pattern 31 that forms a word line WL extends on the field oxide film 30F at the right side of the active region 30B in a direction generally perpendicular to the polysilicon patterns 111A and 111B.

As a result of such a construction, a channel region (not shown) of the p-channel MOS transistor 31a of FIG. 7 is formed in the foregoing active region 30A in correspondence to the polysilicon pattern 111B, wherein $p^+$-type diffusion regions forming the source and drain of the transistor 31a are formed at both sides of the pattern 111B in the active region 30A. Similarly, a channel region of the foregoing p-channel MOS transistor 31c is formed in the active region 30A in correspondence to the polysilicon pattern 111A, and $p^+$-type diffusion regions forming the source and drain of the transistor 31c are formed at both sides of the pattern 111A in the active region 30A.

Similarly, a channel region of the n-channel MOS transistor 31d is formed in the active region 30B in correspondence to the polysilicon pattern 111A, and $n^+$-type diffusion regions forming the source and drain of the transistor 31d are formed at both side of the pattern 111A in the active region 30B. Further, a channel region of the n-channel MOS transistor 31d is formed in the active region 30B in correspondence to the polysilicon pattern 111A, and $n^+$-type diffusion regions forming the source and drain of the transistor 31d are formed at both side of the pattern 111A in the active region 30B.

It should be noted that the drain of the transistor 31a and the drain of the transistor 31c are formed in the active region 30A by a common $p^{30}$-type diffusion region that is formed between the polysilicon patterns 111A and 111B, wherein a drain contact 30a is formed on the active region 30A in correspondence to the $p^+$-type diffusion region. Similarly, the drain of the transistor 31b and the drain of the transistor 31d are formed in the active region 30B by a common $n^+$-type diffusion region that is formed between the polysilicon patterns 111A and 111B, wherein a drain contact 30b is formed on the active region 30B in correspondence to the $n^+$-type region. As will be noted from the circuit diagram of FIG. 7, a supply voltage $V_{DD}$ is supplied to the contact 30a while a reference voltage $V_{SS}$ is supplied to the contact 30b.

It should be noted that the word line WL and the polysilicon patterns 111A and 111B are covered by an elongated insulation pattern 111C having a shape corresponding to the shape of the respective patterns, wherein the insulation pattern 111C is formed with an opening $111C_1$ in correspondence to the field oxide film 30F existing between the active region 30A and the active region 30B and another opening $111C_2$ in correspondence to the polysilicon pattern 111B, wherein it should be noted that the polysilicon pattern 111A carries, on a surface thereof, a silicide layer 111a formed in correspondence to the foregoing opening $111C_1$. Similarly, the polysilicon pattern 111B carries, on the surface thereof, a silicide layer 111b in correspondence to the opening $111C_2$.

Further, an elongated pattern $111D_1$ of W or TiN is formed on the field oxide film 30F with an elongated branch $111d_1$ such that the pattern $111D_1$ contacts with the respective drain regions of the transistors 31c and 31d in the active regions 30A and 30B. Similarly, an elongated pattern $111D_2$ of W or TiN is formed on the field oxide film 30F with an elongated branch $111d_2$ such that the pattern $111D_2$ contacts with the respective source regions of the transistors of the transistors 31a and 31b in the active regions 30A and 30B. Thereby, it should be noted that the branch $111d_1$ of the pattern $111D_1$ is connected to the polysilicon gate pattern 111B at the foregoing silicide region 111b, while the branch $111d_2$ of the pattern $111D_2$ is connected to the polysilicon gate pattern 111A at the silicide region 111a.

Thus, the W pattern $111D_1$ connects the transistors 31c and 31d in series at the respective drains, and thus, the inverter 31B of FIG. 7 is formed. Similarly, the W pattern $111D_2$ connects the transistors 31a and 31b in series at the respective drains and forms the inverter 31A of FIG. 7. Further, the branches $111d_1$ and $111d_2$ of the patterns $111D_1$ and $111D_2$ cross connect the inverters 31A and 31B to form the foregoing flip-flop circuit.

In FIG. 9, it should further be noted that the n-channel MOS transistors 31f and 31e are formed in the active region 30B in correspondence to the cross point of the word line WL over the active region 30B. Further, contact holes 30c and 30d are formed in the active region 30B in the side of the transistors 31e and 31f for connection of the bit lines BL and /BL.

In the memory cell of FIG. 4, it should be noted that the gate patterns 111A and 111B are both formed of $n^+$-type polysilicon. Thus, the memory cell is formed by a simple patterning process of an $n^+$-type polysilicon layer as will be described later. In other words, one can fabricate the memory cell of FIG. 9 with a high integration density and low fabrication cost. Further, by combining the $n^+$-type polysilicon gate to the n-channel MOS transistors 31b and 31d that forms the essential part of the flip-flop circuit, it is possible to reduce the threshold voltage of the transistors 31b and 31d substantially.

Such a construction does not brings a decrease in the threshold voltage of the p-channel MOS transistors 31a and 31c, while it should be noted that the p-channel MOS transistors 31a and 31c merely act as the load of the n-channel MOS transistors 31b and 31d and are not required to have a low threshold voltage.

Figure 11:
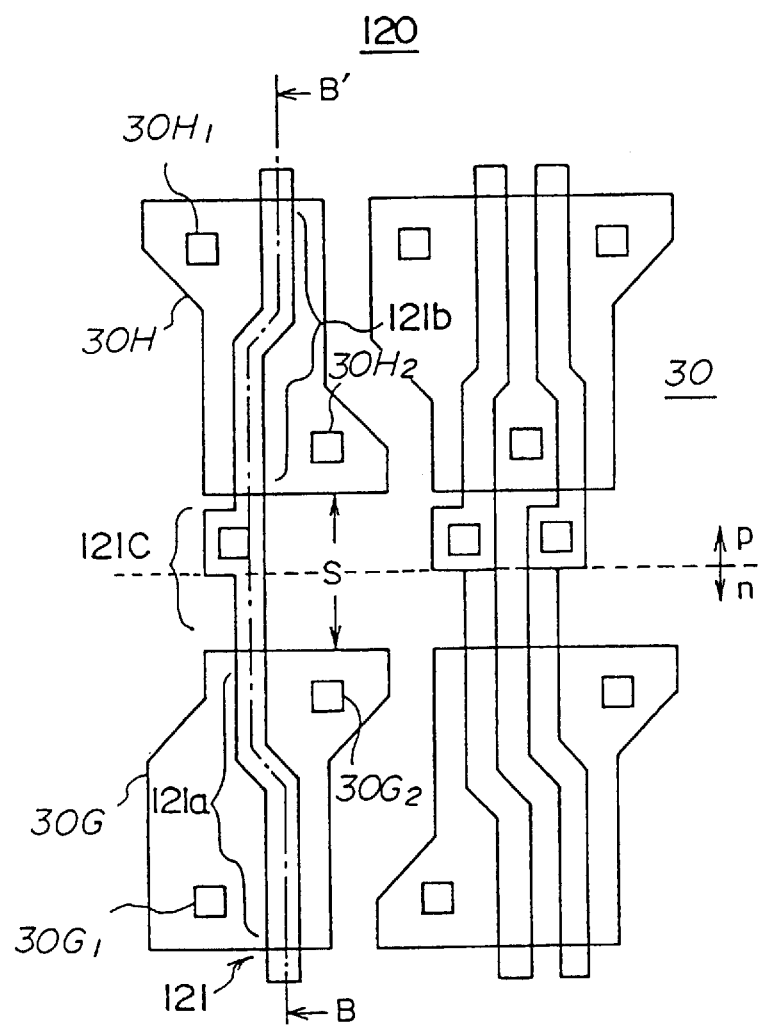
FIG. 11 is a diagram showing the layout of the complementary logic gate of FIG. 8 in a plan view.
Figure 12:
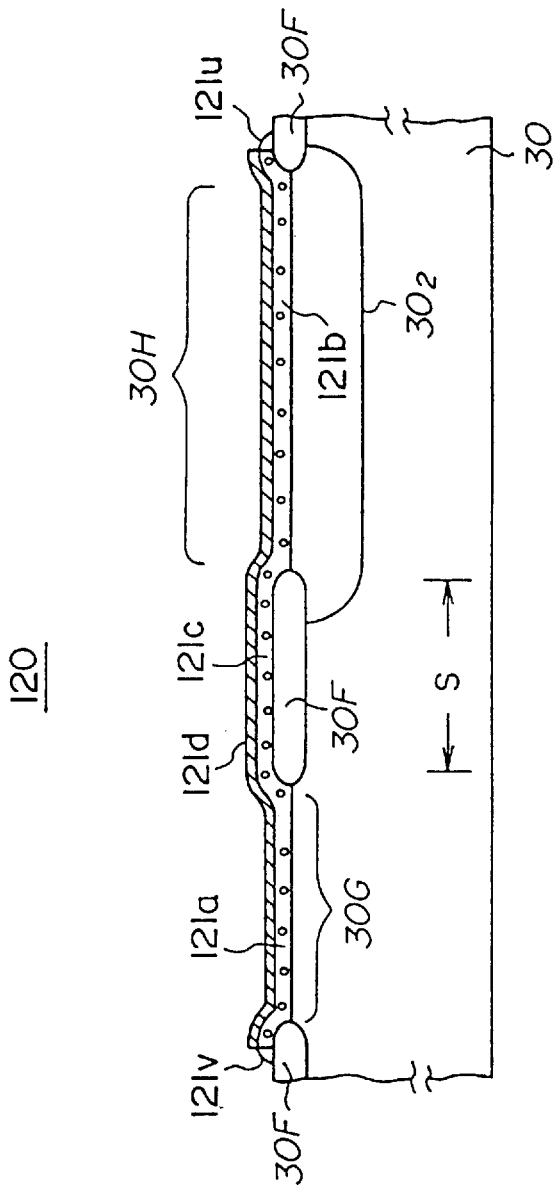
FIG. 12 is a diagram showing the complementary logic gate of FIG. 8 in a cross sectional view taken along a line B—B' of FIG. 11.

Next, the construction of the inverter 120 forming the logic gate circuit 32 of FIG. 6 will be described with reference to the plan view of FIG. 11 and the cross sectional view of FIG. 12, wherein it should be noted that FIG. 12 shows the cross section taken along a line B—B'.

Referring to FIGS. 11 and 12, the inverter 120 is formed in active regions 30G and 30H defined in the field oxide film 30F that covers the surface of the silicon substrate 30, wherein the active region 30H is formed in correspondence to an n-type well $30_2$ formed in the p-type substrate 30. Thus, the active region 30G is doped to the p-type while the active region 30H is doped to the n-type. Similarly to ordinary MOS transistors, each of the active regions 30G and 30H are covered by a thin gate oxide film.

On the field oxide film 30F, it should be noted that a gate pattern 121 of polysilicon is formed such that the gate pattern 121 extends continuously from the active region 30G to the active region 30H, wherein an $n^+$-type diffusion region is formed at both sides of the gate pattern 121 in the p-type active region 30G as the source and drain of the n-channel MOS transistor 32b. Similarly, a $p^+$-type diffusion region is formed at both sides of the gate pattern 121 in the n-type active region 30H as the source and drain of the p-channel MOS transistor 32a. As indicated in FIG. 11, a drain contact $30G_1$ and a source contact $30G_2$ are formed in the active region 30G in correspondence to the foregoing $n^+$-type diffusion regions. Further, a drain contact $30H_1$ and a source contact $30H_2$ are formed in the active region 30H in correspondence to the foregoing $p^+$-type diffusion regions. One obtains the inverter 120 of FIG. 8 by connecting the source contact $30H_1$ and the source contact $30H_2$ by a conductor pattern.

In the construction of FIG. 11, it should be noted that the polysilicon pattern 121 includes a first part 121a extending over the p-type active region 30G and a second part 121b extending over the n-type active region 30H, wherein the first part 121a is doped to the n-type while the second part 121b is doped to the p-type. As a result, the n-channel MOS transistor 32a formed in the active region 30G and the p-channel MOS transistor 32b formed in the active region 30H both have a low threshold voltage and a corresponding large current driving power.

In the construction of FIG. 11, there is formed an intermediate polysilicon region 121c between the foregoing n-type and p-type regions 121a and 121b of the polysilicon pattern 121, wherein the surface of the polysilicon pattern 121 is formed with a silicide layer 121d that extends continuously from the region 121a to the region 121b. Thereby, the n-type region 121a and the p-type region 121b do not contact with each other directly, and the formation of p-n junction in the polysilicon pattern 121 is effectively avoided.

Referring to the cross sectional view of FIG. 12, side wall insulations 121u and 121v of $SiO_2$ are formed on both ends of the polysilicon pattern 121, and the foregoing silicide layer 121d extends over the surface of the polysilicon pattern 121 from the region 121a to the region 121b. It should be noted that the formation of such a silicide region 121c is achieved by causing a reaction in the part of the surface of the polysilicon pattern exposed by the opening 122a with a refractory metal such as Co. Such a reaction may be achieved by an RTA (rapid thermal annealing) process typically conducted at 800° C. for 30 seconds.

In the present embodiment, the active region 30G and the active region 30H are separated from each other by a distance S that is set at least larger than 1 $\mu$m, preferably larger than 2 $\mu$m. Thereby, the problem of diffusion of the n-type dopants in the n-type polysilicon region 121a into the p-type polysilicon region 121b or the problem of diffusion of the p-type dopants in the p-type polysilicon region 121b into the n-type polysilicon region 121a is successfully avoided, even when such a heat treatment process is conducted.

It should be noted that logic gate of FIG. 11 is provided in a plural number, while the illustration and description of such plural logic gates are omitted for the sake of simplicity of description.

Figure 13A:
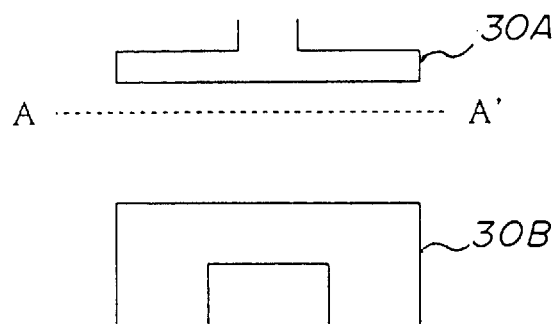
Figure 13B:
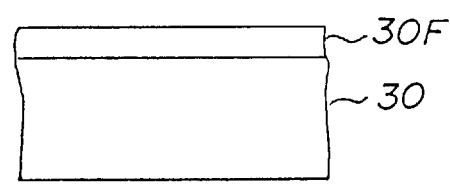

Next, the fabrication process of the memory cell 110 of FIGS. 9 and 10 will be described with reference to FIGS. 13A–13L, wherein it should be noted that FIG. 13B shows a cross section taken along the line A—A' of FIG. 13A. A similar correspondence holds also in FIGS. 13C–13L.

In the step of FIGS. 13A and 13B, formation of the field oxide film 30F is achieved on the p-type silicon substrate 30, in which the n-type well $10_1$ is already formed, by a conventional LOCOS process to define the active regions 30A and 30B. Further, a gate oxide film (not shown) is formed on the active regions 30A and 30B by a thermal oxidation process with a thickness of typically 7 nm.

Figure 13C:
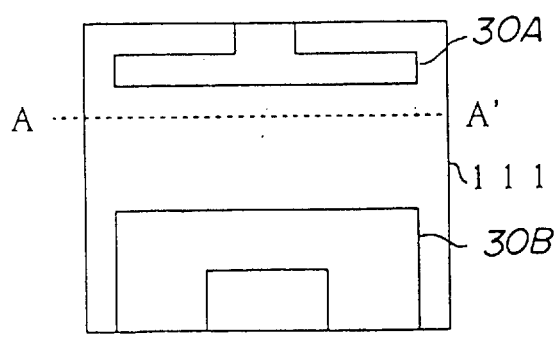
Figure 13D:
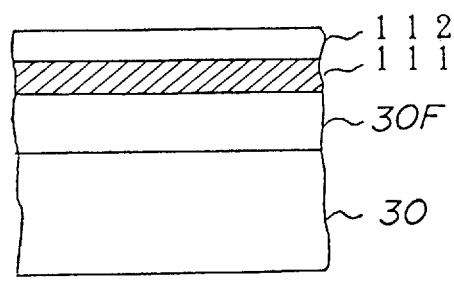

Next, in the step of FIGS. 13C and 13D, a polysilicon layer 111 is deposited by a CVD process with a thickness of typically 180 nm, followed by an ion implantation process to dope the same to the $n^+$-type. Further, a silicon oxide film 112 is deposited on the polysilicon layer 111 by a CVD process with a thickness of 100 nm. As a result, the structure shown in FIGS. 13C and 13D is obtained.

Figure 13E:
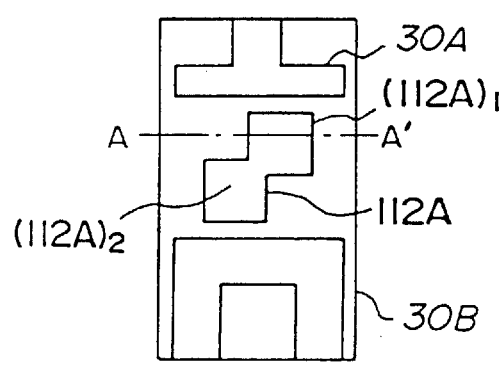
Figure 13F:
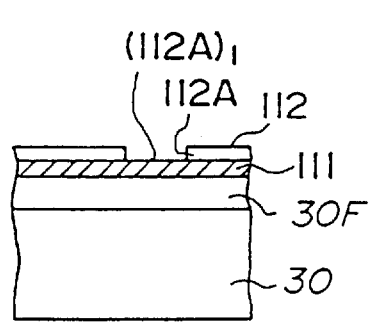

Further, in the step of FIGS. 13E and 13F, an opening 112A is formed in the silicon oxide film 112 such that the regions 111a and 111b of FIG. 9 are exposed. It will be noted from FIG. 13E that the opening 112A includes a first region $(112A)_1$ and a second region $(112A)_2$ that are disposed with a staggered relationship in correspondence to the regions 111a and 111b.

Figure 13G:
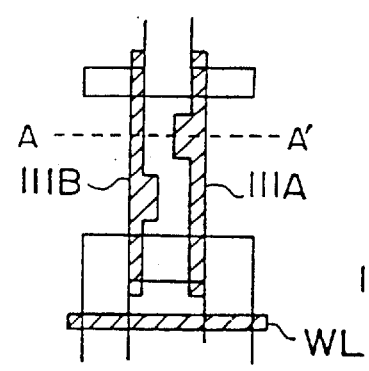
Figure 13H:
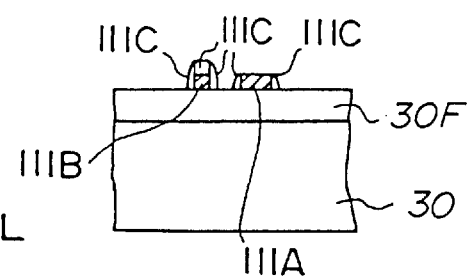

Next, in the step of FIGS. 13G and 13H, the polysilicon layer 111 is patterned together with the silicon oxide film 112 thereon to form the polysilicon gate patterns 111A and 111B as shown in FIG. 9, followed by an ion implantation process of $BF_2^+$ into the active region 30A to form the drain and source of the p-channel MOS transistors 31a and 31c. Typically, the ion implantation of $BF_2^+$ is conducted under the acceleration energy of 25 keV with a dose of $2 \times 10^{15}$ cm$^{-2}$. Further, an ion implantation process of $As^+$ is conducted into the active region 30B to form the drain and source of the n-channel MOS transistors 31b and 31d, wherein the ion implantation of $As^+$ may be conducted under the acceleration energy of 25 keV with the dose of $2 \times 10^{15}$cm$^{-2}$, similarly as in the case of ion implantation of $BF_2^+$.

Further, another silicon oxide film not shown is deposited on the patterns 111A and 111B by a CVD process with a thickness of about 100 nm, followed by an RIE process of the silicon oxide film thus deposited, wherein the RIE process is conducted vertically to the principal surface of the substrate 30 until the regions 111a and 111b are exposed. Thereby, one obtains a structure having a cross section of FIG. 13H wherein the polysilicon patterns 111A and 111B are covered by the silicon oxide pattern 111C except for the regions 111a and 111b.

Referring to FIG. 13H, it will be noted that the polysilicon pattern 111A exposes the surface thereof in the cross sectional view taken along the line A—A', while the polysilicon pattern 111B is covered by the silicon oxide pattern 111C. In the cross section of FIG. 13H, it should further be noted that the polysilicon patterns 111A and 111B have the side walls covered by the silicon oxide pattern 111C.

In the step of FIGS. 13G and 13H, the word line WL is formed as a result of patterning of the polysilicon layer 111, in addition to the gate patterns 111A and 111B, and the diffusion regions of the transistors 31e and 31f are formed in the active region 30B at both sides of the word line WL.

Next, a Co layer is deposited in the step of FIGS. 13I and 13J on the structure obtained by the step of FIGS. 13G and 13H, wherein the structure thus obtained is subjected to an RTA process conducted at 800° C. for 30 seconds. As a result of such an RTA process, a layer of Co silicide is formed on the polysilicon pattern 111A as the silicide layer 111a.

Further, a layer of W is deposited on in the step of FIGS. 13K and 13L with a thickness of about 80 nm, wherein the W layer thus deposited is subjected to a patterning process to form the patterns $111D_1$ and $111D_2$ as indicated in FIG. 9. As will be noted from the cross section of FIG. 13L, the pattern $111D_2$ bridges across the polysilicon pattern 111B without contacting therewith and provides an interconnect that connects the silicide region 111a of the pattern 111A to the source of the transistors 31a and 31b. Similarly, the W pattern $111D_1$ bridges across the polysilicon pattern 111A without contacting the same and connects the silicide region 111b of the pattern 111B to the source of the transistors 31c and 31d. As a result, the inverters 31A and 31B are cross connected to form the memory cell 110 of FIG. 7.

Next, the fabrication process of the inverter 120 that forms the logic gate circuit of FIGS. 11 and 12 will be described with reference to FIGS. 14A–14F.

Figure 14A:
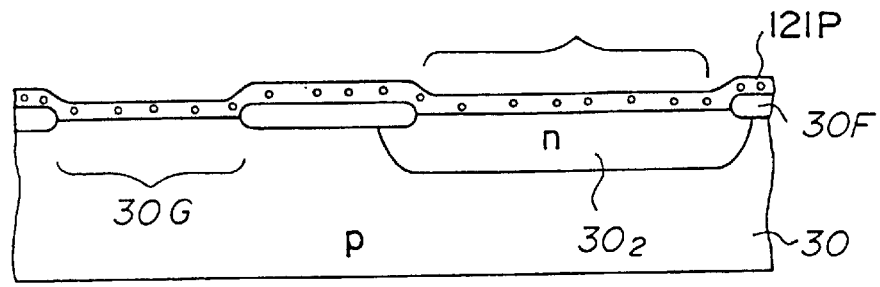
FIGS. 14A–14F are diagrams showing the fabrication process of the complementary logic gate of FIG. 12.

In the step of FIG. 14A, an ordinary LOCOS process is conducted on the p-type silicon substrate 30, in which the n-type well 10₂ is formed, to form the gate oxide film 30F such that the field oxide film 30F defines the active regions 30G and 30H. Further, a gate oxide film not illustrated is formed on each of the active regions 30G and 30H by an ordinary thermal oxidation process with a thickness of typically 7 nm. Further, a polysilicon layer 121P is deposited thereon by a CVD process with a thickness of about 180 nm, wherein the polysilicon layer forms a polysilicon pattern after being patterned.

Figure 14B:
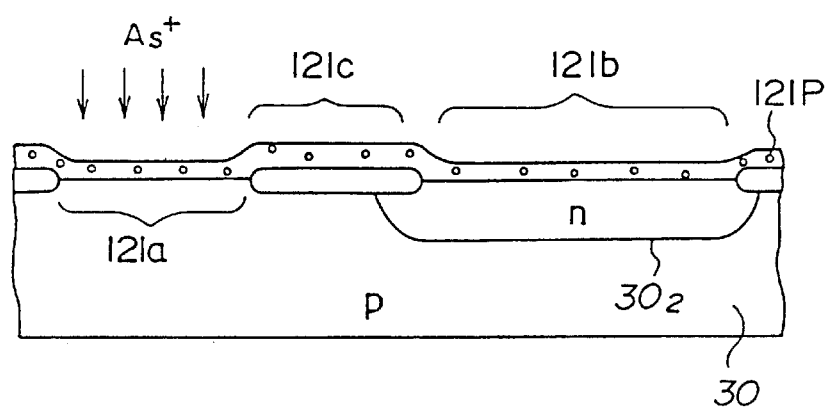

Next, in the step of FIG. 14B, a resist mask is formed on the structure of FIG. 14A such that the resist mask exposes the active region 30G, and an ion implantation of $As^+$ is conducted into the part of the polysilicon layer 121P corresponding to the active region 30G to dope the same to the n-type, wherein the ion implantation of $As^+$ may be conducted under the acceleration energy of 25 keV and a dose of $2 \times 10^{15}$ cm$^{-2}$.

Figure 14C:
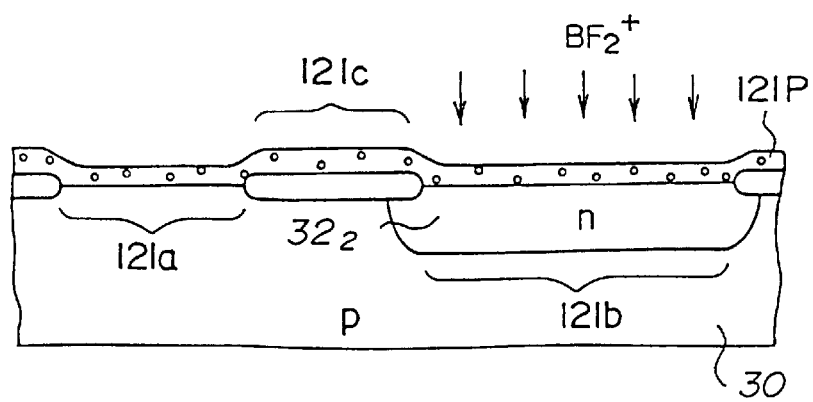

Next, in the step of FIG. 14C, the silicon oxide film 112 described previously with reference to the formation of the memory cell, is deposited on the entire surface of the substrate 30 by a CVD process, wherein the silicon oxide film 112 thus deposited is removed from the region of the logic gate circuit. Thus, the structure thus obtained is substantially identical with the structure of FIG. 14B. Further, a resist mask is provided on the structure thus obtained so as to expose the active region 30H, and an ion implantation of $BF_2^+$ is conducted into the polysilicon layer 121P in correspondence to the active region 30H. Similarly as before, the ion implantation is conducted under the acceleration energy of 25 keV and the dose of $2 \times 10^{15}$ cm$^{-2}$.

Figure 14D:
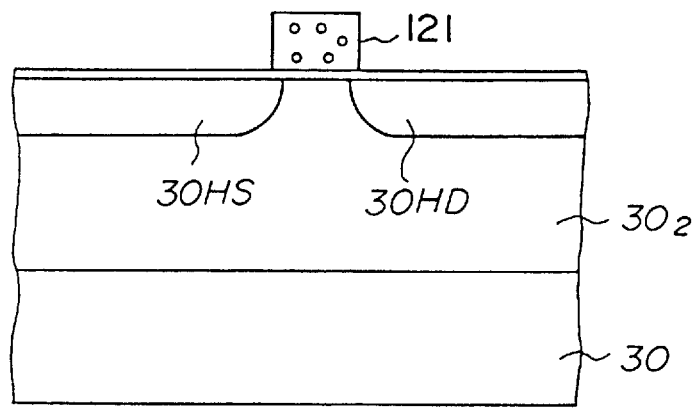

Next, in the step of FIG. 14D, the gate pattern 121 is formed as a result of patterning of the polysilicon layer 121P, and ion implantation of $BF_2^+$ is conducted while using the gate pattern 121 as a self-alignment mask to form diffusion regions 30HA and 30HD of the p$^+$-type as the source and drain of the p-channel MOS transistor 32a. It should be noted that FIG. 14D shows the cross section taken along a plan perpendicular to the elongating direction of the polysilicon gate pattern in the active region 30H. A similar self-alignment ion implantation is conducted also in the active region 30G, and diffusion regions (not shown) of the n$^+$-type serving for the source and drain of the n-channel MOS transistor 32b are formed.

Figure 14E:
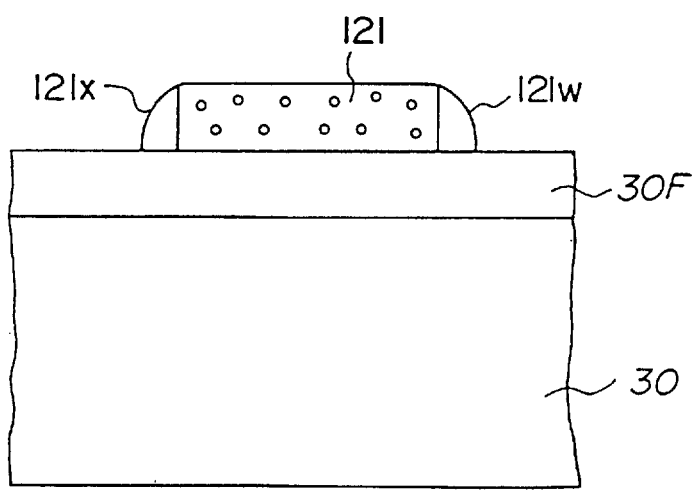

Further, a silicon oxide film is deposited so as to bury the polysilicon pattern 121 underneath, followed by an RIE process conducted vertically to the major surface of the substrate 30 to form the structure of FIG. 14E, wherein it will be noted that the polysilicon pattern 121 carries side wall insulations 121w and 121x on both side walls thereof. It should be noted the FIG. 14E is a cross sectional view taken along a plane perpendicular to the elongating direction of the polysilicon pattern 121 similar to the cross sectional diagram of FIG. 14D, while FIG. 14E is different from the cross sectional view of FIG. 14D in the point that the cross section of FIG. 14E intersects the field oxide film 30f locating between the active region 30G and the active region 30H. It should be noted that the active region 30H shows the cross section intersecting the active region 30H.

Figure 14F:
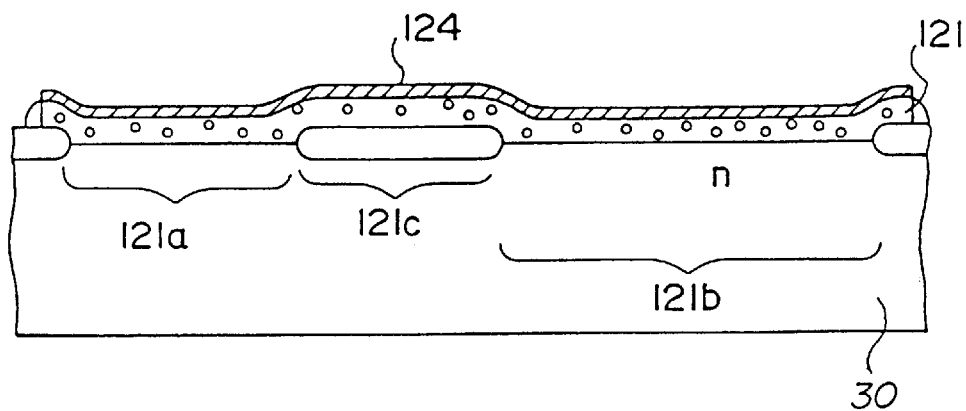

Next, in the structure of FIG. 14F, a refractory metal layer 124 such a layer of Co is deposited on the structure of FIG. 14E, followed by an RTA process to form the structure of FIG. 12 in which a silicide layer is formed on the entire gate pattern. Here, the refractory metal layer 124 is by no means limited to Co but may also be other refractory metals such as W or Mo.

In the structure of FIG. 12, it should be noted the problem of mutual diffusion of the n-type dopants in the n-type polysilicon region 121a and the p-type dopants in the p-type polysilicon region 121b is successfully avoided by setting the length S of the polysilicon region 121c to be at least larger than 1 μm, preferably larger than 2 μm. In such a construction, each of the p-channel MOS transistor in the active region 30G and the n-channel MOS transistor in the active region 30H has a low threshold voltage and a large current driving power. As the logic gate circuit having such a construction is provided in the peripheral circuit region 12 of the memory integrated circuit, the decrease of integration density of the logic gate circuit, caused as a result of increased distance S between the active region 30F and the active region 30G, does not raise any problems.

Further, the present invention is not limited to the embodiments described heretofore, but various variations and modifications may be made without departing from the scope of the invention.

What is claimed is:

1. A semiconductor integrated circuit device, comprising:
a substrate;
a first semiconductor device provided on said substrate, said first semiconductor device having a pair of substrates, each having a diffusion region connected to each other by a first local interconnect pattern which bridges across a first conductor pattern formed between said pair of transistors of said first semiconductor device, without contacting with said first conductor pattern; and
a second semiconductor device, separate from said first semiconductor device, having a pair of transistors, each having a diffusion region connected to each other by a second local interconnect pattern which crosses a second conductor pattern formed between said pair of transistors of said second semiconductor device, while electrically contacting said second conductor pattern.

2. A semiconductor integrated circuit device, comprising:
a substrate;
a plurality of memory cells provided on said substrate, each of said memory cells comprising a flip-flop circuit formed of a cross-coupling of first and second inverter circuits; and
a complementary logic circuit provided on said substrate and formed of an n-channel MOS transistor and a p-channel MOS transistor;
in each of said plurality of memory cell, each of said first and second inverters including a p-channel MOS transistor and an n-channel MOS transistor connected in series, each of said first and second inverters further including a single semiconductor pattern extending between said p-channel MOS transistor and said n-channel MOS transistor as a gate, said single semiconductor pattern having a work function that is identical in the p-channel MOS transistor and said n-channel MOS transistor that form said first and second inverters;
in said complementary logic circuit, said n-channel MOS transistor and said p-channel MOS transistor having respectively first and second semiconductor strips as a gate electrode, said first semiconductor strip having a work function lower than a work function of said second semiconductor strip;
wherein said first semiconductor strip and said second semiconductor strip are short-circuited, in said complementary logic gate circuit, by a metal compound of a semiconductor material.

3. A semiconductor integrated circuit device as claimed in claim 2, wherein said n-channel MOS transistor and said p-channel MOS transistor forming said complementary logic circuit are formed such that said first semiconductor strip of said n-channel MOS transistor and said second semiconductor strip of said p-channel MOS transistor are separated by a distance equal to or larger than 1 μm, such that said metal compound extends between said first semiconductor strip of said n-channel MOS transistor and said second semiconductor strip of said p-channel MOS transistor for a length equal to or larger than 1 μm.

4. A semiconductor integrated circuit device as claimed in claim 2, wherein said first and second semiconductor strips form a first region and a second, different region separated from said first region, each of said first and second regions being defined in a second single semiconductor pattern, wherein said single semiconductor pattern carries said metal compound thereon between said first region and said second region.

5. A semiconductor memory integrated circuit as claimed in claim 4, wherein said first and second semiconductor strips forming said complementary logic circuit are both made of silicon, wherein said first semiconductor strip is doped to the n-type and said second semiconductor strip is doped to the p-type.

6. A semiconductor memory integrated circuit as claimed in claim 2, wherein said metal compound comprises silicide.

7. A semiconductor memory integrated circuit as claimed in claim 2, wherein said p-channel MOS transistor and said n-channel MOS transistor forming said complementary logic circuit have respective active regions that are separated from each other by 1 μm or more.

8. A semiconductor memory integrated circuit as claimed in claim 2, wherein said single semiconductor pattern of said first and second inverter circuits comprises a single polysilicon strip doped to the n-type.

* * * * *

UNITED STATES PATENT AND TRADEMARK OFFICE
CERTIFICATE OF CORRECTION

PATENT NO.:     5,850,096
DATED      :    December 15, 1998
INVENTOR(S):    Izawa et al.

It is certified that an error appears in the above-identified patent and that said Letters Patent is hereby corrected as shown below:

On the title page;

Item [75], the inventors, "Hiroshi Goto and Koichi Hashimoto" should be deleted therefor.

Signed and Sealed this

Twenty-third Day of November, 1999

Attest:

Q. TODD DICKINSON

*Attesting Officer*    *Acting Commissioner of Patents and Trademarks*